(12) United States Patent
Kajigaya

(10) Patent No.: US 8,624,313 B2
(45) Date of Patent: Jan. 7, 2014

(54) METHOD OF MANUFACTURING SEMICONDUCTOR MEMORY DEVICE

(76) Inventor: Kazuhiko Kajigaya, Tokyo (JP)

( * ) Notice: Subject to any disclaimer, the term of this patent is extended or adjusted under 35 U.S.C. 154(b) by 120 days.

(21) Appl. No.: 13/137,701

(22) Filed: Sep. 6, 2011

(65) Prior Publication Data

US 2011/0315945 A1    Dec. 29, 2011

Related U.S. Application Data

(63) Continuation of application No. 12/149,439, filed on May 1, 2008, now Pat. No. 8,017,457.

(30) Foreign Application Priority Data

May 9, 2007    (JP) .............................. P2007-124554

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl.
USPC ...... 257/296; 257/68; 257/298; 257/E21.006; 257/E21.027; 257/E21.058; 257/E21.267; 257/E21.304; 257/E21.4; 257/E21.411; 257/E21.646

(58) Field of Classification Search
USPC ............... 257/68, 296, 301, 300, 298, 322, 257/E21.006, E21.027, E21.058, E21.267, 257/E21.304, E21.4, E21.411, E21.646
See application file for complete search history.

(56) References Cited

U.S. PATENT DOCUMENTS

| | | | |
|---|---|---|---|
| 6,426,671 B1 | 7/2002 | Kono | |
| 7,274,587 B2 | 9/2007 | Yasuda | |
| 7,436,699 B2 | 10/2008 | Tanizaki et al. | |
| 8,017,475 B1 * | 9/2011 | Carns et al. | 438/254 |
| 2006/0098473 A1 | 5/2006 | Yasuda | |

FOREIGN PATENT DOCUMENTS

| | | |
|---|---|---|
| JP | 2004-342843 | 12/2004 |
| JP | 2006-173267 | 6/2006 |

* cited by examiner

*Primary Examiner* — David Nhu
(74) *Attorney, Agent, or Firm* — McGinn IP Law Group, PLLC

(57) ABSTRACT

A semiconductor device includes a semiconductor substrate, a non-volatile semiconductor memory element formed over the semiconductor substrate, including a variable resistance element including a laminate comprising a first electrode, a variable resistance layer, and a second electrode, and a volatile semiconductor memory element formed over the semiconductor substrate, including a capacitance element including a laminate comprising a third electrode, a dielectric layer including a same material as the variable resistance layer, and a fourth electrode.

22 Claims, 24 Drawing Sheets

METHOD OF MANUFACTURING SEMICONDUCTOR MEMORY DEVICE

The present application is a Continuation Application of U.S. patent application Ser. No. 12/149,439, filed on May 1, 2008, now U.S. Pat. No. 8,017,457 which is based on Japanese patent application No. 2007-124554, filed on May 9, 2007, the entire contents of which is incorporated herein by reference.

BACKGROUND OF THE INVENTION

1. Field of the Invention

The present invention relates to a method of manufacturing a semiconductor memory device. The present invention particularly relates to a method of manufacturing a non-volatile semiconductor memory element having a limit on the number of times of rewriting information and a volatile semiconductor memory element such as DRAM having no upper limit on the number of times of rewriting information with high integration on the same semiconductor substrate and at low cost.

2. Description of Related Art

In recent years, resistance RAM (RRAM) having a variable resistance memory element as memory that is used in information equipment such as computers and mobile telephones and the like has been receiving attention. A variable resistance memory element is a memory element that is basically constituted by a thin film resistor such as a binary metal oxide, a transition metal oxide, an aluminum oxide, a silicon oxide or germanium oxide being sandwiched between two electrodes, and makes use of the phenomenon in which the resistance of the thin film resistor changes by impressing an electrical field or flowing an electrical current across the electrodes.

Since the resistance value of the thin-film resistor is stored even when the impression of the electrical field or current is removed, it is possible to realize non-volatile memory. The information that is stored in the variable resistance memory element can be read out by comparing the resistance value with a reference value. This kind of memory element is generally called RRAM as mentioned above. It is possible to constitute a variable resistance memory element in an array such as DRAM (Dynamic Random Access Memory) by combining with a selection transistor.

For example, FIG. 25 shows a non-volatile semiconductor memory element disclosed in Japanese Unexamined Patent Application, First Publication, No. 2004-342843 as an example of a variable resistance memory element that can readily store and read out information, and can be readily manufactured with a comparatively easy manufacturing method. FIG. 26 shows a non-volatile semiconductor memory element disclosed in Japanese Unexamined Patent Application, First Publication, No. 2006-173267 as an example of another example of a variable resistance memory element that can stably perform operations such as recording information with a constitution that is stable even with respect to heat.

The non-volatile semiconductor memory element shown in FIG. 25 has a substrate 401, a lower electrode 402, an insulation film 403, an amorphous thin film 404, an upper electrode 405, an electrode layer 406, and a conduction layer 407. Also, non-volatile semiconductor memory element shown in FIG. 26 has a substrate 501, a lower electrode 502, an ion source layer 503, a memory layer 504, an insulating layer 505 denoted by reference numeral 505, and an upper electrode 506.

The conventional memory elements shown above utilize the oxidation-reduction action of metal, such as silver, copper, or zinc. Specifically, when an electrical field is impressed on a thin-film resistor (the amorphous thin film 404 and the memory layer 504) consisting of a transition metal oxide, an aluminum oxide, a silicon oxide or germanium oxide sandwiched between two electrodes (the upper electrodes 405 and 506 and the lower electrodes 402 and 502), the aforementioned metal that exists in one electrode is oxidized (ionized), moves through the thin-film electrode to be reduced and deposited at the other electrode, whereby the resistance value of the thin-film electrode falls. Also, when an electrical field is impressed in the reverse direction, the deposited metal is once again ionized and returns to the original electrode, and so the resistance value of the thin-film electrode rises. Thereafter, even if the electrical field between the electrodes is removed, the resistance value of the thin-film resistor is maintained, and information is stored in a non-volatile manner using this phenomenon. In addition, these memory elements are capable of reading and writing at high speeds on par with DRAM, and so their use as non-volatile RAM has been expected.

However, it is has been reported that the abovementioned memory elements have a limit to the number of changes of the resistance value of the thin-film resistor, that is, the number of times of rewriting information. Accordingly, the abovementioned memory element is not suitable for uses in which information is frequently rewritten as work memory, such as DRAM (Dynamic Random Access Memory) Therefore, there is a problem that it cannot be used as non-volatile RAM for realizing computer systems, mobile phones, information appliance products, etc. with an instant-on function.

On the other hand, while DRAM is suited to uses such as information being frequently rewritten as work memory, due to its being volatile memory, it has the characteristic of the information being lost when the power is turned off.

In this way, since RRAM and DRAM have a relationship of complementing each other, it has been desired for them to be used in combination. Therefore, if it were possible to form these two types of memory elements with the same manufacturing process and on the same chip, it would be possible to provide a memory system that is easy to use at a low cost, and so its realization has been sought.

The present invention has been achieved in view of the above circumstances, and has as its object to provide a method of manufacturing a non-volatile semiconductor memory having a limit on the number of times of rewriting information and a volatile semiconductor memory element such as DRAM having no upper limit on the number of times of rewriting information with high integration on the same semiconductor substrate and at low cost.

SUMMARY OF THE INVENTION

In order to achieve the abovementioned object, the present invention adopts the following constitution.

A method of manufacturing a semiconductor memory device of the present invention comprises the steps of forming a first selection transistor and a second selection transistor; forming a variable resistance element by sequentially laminating a first electrode that is connected to the first selection transistor, a variable resistance layer that contacts the first electrode, and a second electrode that contacts the variable resistance layer; and forming a capacitance element by sequentially laminating a third electrode that is connected to the second selection transistor, a dielectric layer that contacts the third electrode and consists of the same material as the variable resistance layer, and a fourth electrode that contacts the dielectric layer; wherein either one of the first electrode or the second electrode is formed with the same material as the third electrode and the fourth electrode, while the other one of the first electrode or the second electrode is formed with a different material than the third electrode and the fourth electrode, and the semiconductor memory device is formed on a same semiconductor substrate with a non-volatile semiconductor memory element provided with the first selection transistor and the variable resistance element that is connected to the first selection transistor, and a volatile semiconductor memory element provided with the second selection transistor and the capacitance element that is connected to the second selection transistor.

Also, in the method of manufacturing a semiconductor memory device of the present invention, it is preferable that, other than forming the other one of the first electrode or the second electrode with a different material than the third electrode and the fourth electrode, the step of forming the volatile semiconductor memory element and the step of forming the non-volatile semiconductor memory element be essentially the same.

Also, in the method of manufacturing a semiconductor memory device of the present invention, it is preferable in the step of forming the variable resistance element and the step of forming the capacitance element to simultaneously form a first electrode dummy electrode and the third electrode with the same material; form the first electrode with a different material than the third electrode after removing the first electrode dummy electrode; simultaneously form the dielectric layer and the variable resistance layer on the first electrode and the third electrode, respectively; and simultaneously form the second electrode and the fourth electrode consisting of the same material as the third electrode on the dielectric layer and the variable resistance layer, respectively.

Furthermore, in the method of manufacturing a semiconductor memory device of the present invention, it is preferable in the step of forming the variable resistance element and the step of forming the capacitance element to simultaneously form the first electrode and the third electrode with the same material; simultaneously form the dielectric layer and the variable resistance layer on the first electrode and the third electrode, respectively; simultaneously form a second electrode dummy electrode and the fourth electrode with the same material as the first electrode and the third electrode on the dielectric layer and the variable resistance layer, respectively; and form the second electrode with a different material than the first, third and fourth electrodes after removing the second electrode dummy electrode.

Also, in the method of manufacturing a semiconductor memory device of the present invention, it is preferable in the step of forming the variable resistance element and the step of forming the capacitance element to simultaneously form the first electrode and the third electrode with the same material; simultaneously form the dielectric layer and the variable resistance layer on the first electrode and the third electrode, respectively; simultaneously form the second electrode and a fourth electrode dummy electrode with a different material than the first electrode and the third electrode on the dielectric layer and the variable resistance layer, respectively; and form the fourth electrode with the same material as the first and third electrodes after removing the fourth electrode dummy electrode.

Moreover, in the method of manufacturing a semiconductor memory device of the present invention, it is preferable to laminate the fourth electrode on the second electrode.

Moreover, in the method of manufacturing a semiconductor memory device of the present invention, it is preferable in the step of forming the variable resistance element and the step of forming the capacitance element to simultaneously form a first electrode dummy electrode and the third electrode with the same material; remove a portion of the first electrode dummy electrode and form the first electrode on the remaining first electrode dummy electrode with a different material than the third electrode; simultaneously form the dielectric layer and the variable resistance layer on the first electrode and the third electrode, respectively; and simultaneously form the second electrode and the fourth electrode each consisting of the same material as the third electrode on the dielectric layer and the variable resistance layer, respectively.

Moreover, in the method of manufacturing a semiconductor memory device of the present invention, it is preferable that the material that constitutes the dielectric layer and the variable resistance layer includes any one or a mixture of a transition metal oxide, an aluminum oxide, and a silicone oxide.

Furthermore, in the method of manufacturing a semiconductor memory device of the present invention, it is preferable that the transition metal oxide consists of any one or a mixture of tantalum oxide, niobium oxide, hafnium oxide, and zirconium oxide.

Furthermore, in the method of manufacturing a semiconductor memory device of the present invention, it is preferable to form the third electrode and the fourth electrode and either one of the first electrode and the second electrode with any of tungsten, titanium, platinum, and gold.

Furthermore, in the method of manufacturing a semiconductor memory device of the present invention, it is preferable that the other of the first electrode and the second electrode be formed with any of silver, copper, and zinc.

According to the aforementioned method of manufacturing a semiconductor memory device, in the step of forming the variable resistance element and the step of forming the capacitance element, by forming the dielectric layer and the variable resistance layer with a mutually identical material, forming either of the first electrode or the second electrode with the same material as the third electrode and the fourth electrode, and forming the other of the first electrode or the second electrode with a different material than the third electrode and the fourth electrode, it is possible to readily form the non-volatile semiconductor memory element and the volatile semiconductor memory element on the same semiconductor substrate.

Also, according to the aforementioned method of manufacturing a semiconductor memory device, other than forming the other one of the first electrode or the second electrode with a different material than the third electrode and the fourth electrode, the step of forming the volatile semiconductor memory element and the step of forming the non-volatile semiconductor memory element are essentially the same. Therefore, it is possible to manufacture a volatile semiconductor memory element and a non-volatile semiconductor memory element nearly simultaneously.

Also, the aforementioned method of manufacturing a semiconductor memory device is a method that forms a first electrode dummy electrode simultaneously with the third electrode and with the same material as the third electrode, forms the first electrode with a different material than the third electrode after removing the first electrode dummy electrode, and sequentially forms the dielectric layer and variable resistance layer and the second electrode and fourth electrode, and just by adding a series of steps of formation and removal of the first electrode dummy electrode and formation of the first electrode, it is possible to readily and with a high integration form a volatile semiconductor memory element and a non-volatile semiconductor memory element.

Furthermore, the aforementioned method of manufacturing a semiconductor memory device is a method that forms a second electrode dummy electrode simultaneously with the fourth electrode and with the same material as the fourth electrode and forms the second electrode with a different material than the first, third, and fourth electrodes after removing the second electrode dummy electrode, and so just by adding a series of steps of formation and removal of the second electrode dummy electrode and formation of the second electrode, it is possible to readily and with a high integration form a volatile semiconductor memory element and a non-volatile semiconductor memory element.

Furthermore, the aforementioned method of manufacturing a semiconductor memory device is a method that forms a fourth electrode dummy electrode simultaneously with the fourth electrode and with a different material than the first and third electrodes, and forms the fourth electrode with the same material as the first and third electrodes after removing the fourth electrode dummy electrode, and so just by adding a series of steps of formation and removal of the fourth electrode dummy electrode and formation of the fourth electrode, it is possible to readily and with a high integration form a volatile semiconductor memory element and a non-volatile semiconductor memory element.

Furthermore, the aforementioned method of manufacturing a semiconductor memory device is a method that forms a first electrode dummy electrode simultaneously with the third electrode and with the same material as the third electrode, and forms the first electrode with a different material than the third electrode after removing a portion of the first electrode dummy electrode, and so just by adding a series of steps of formation of the first electrode dummy electrode, removal of a portion thereof and formation of the first electrode, it is possible to readily and with a high integration form a volatile semiconductor memory element and a non-volatile semiconductor memory element.

According to the method of manufacturing a semiconductor memory device of the present invention, it is possible to manufacture a non-volatile semiconductor memory element having a limit on the number of times of rewriting information and a volatile semiconductor memory element such as DRAM having no upper limit on the number of times of rewriting information with high integration on the same semiconductor substrate and at low cost.

DETAILED DESCRIPTION OF THE INVENTION

Hereinbelow, a method of manufacturing a semiconductor memory device of the present invention shall be described with reference to the drawings. Note that the drawings referred to in the description below are for describing a method of manufacturing a semiconductor memory device of the present embodiments, and size, thickness and dimensions of each portion illustrated may differ from the dimensional relationship of each portion in the actual semiconductor device and the manufacturing method thereof.

[First Embodiment]

Figure 1A:
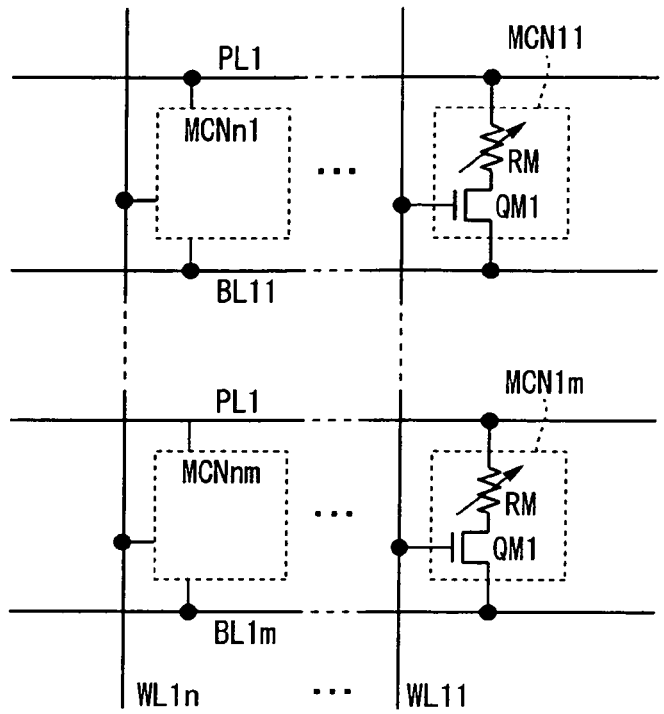
FIGS. 1A and 1B are circuit diagrams showing the circuit composition of the semiconductor memory device which is the first embodiment the present invention.
Figure 1B:
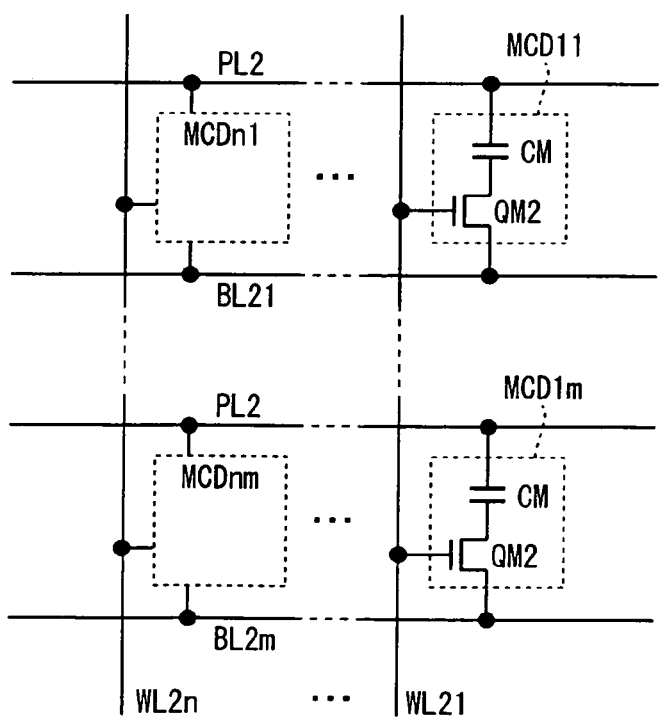
Figure 2A:
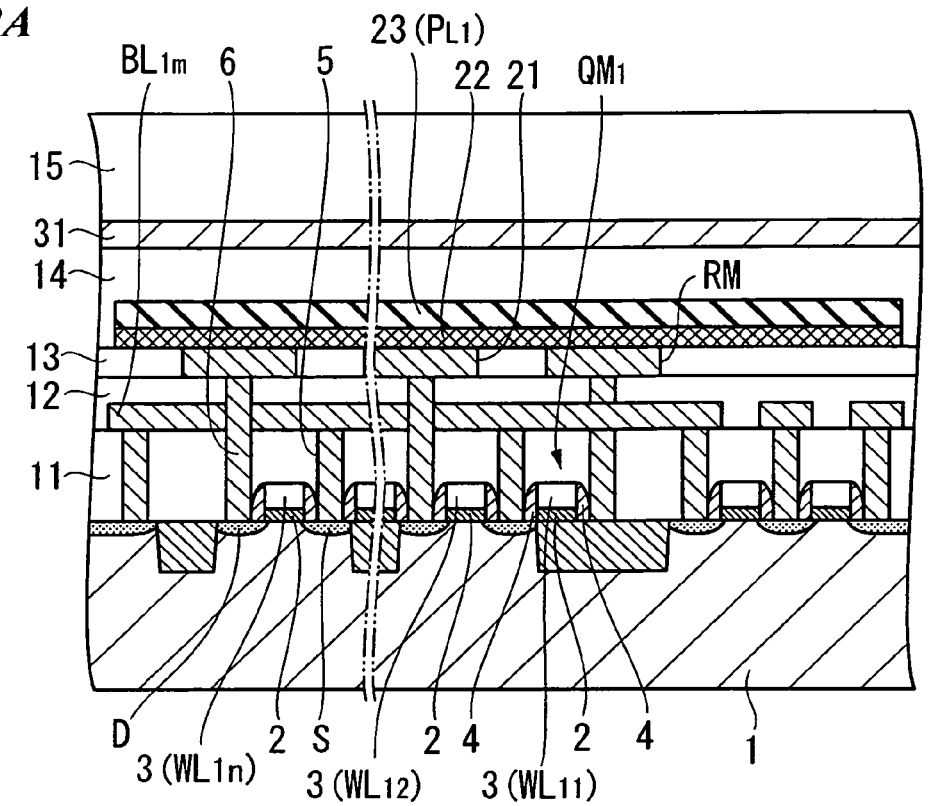
FIGS. 2A and 2B are partial sectional drawings showing the main portions of the semiconductor memory device which is the first embodiment of the present invention.
Figure 2B:
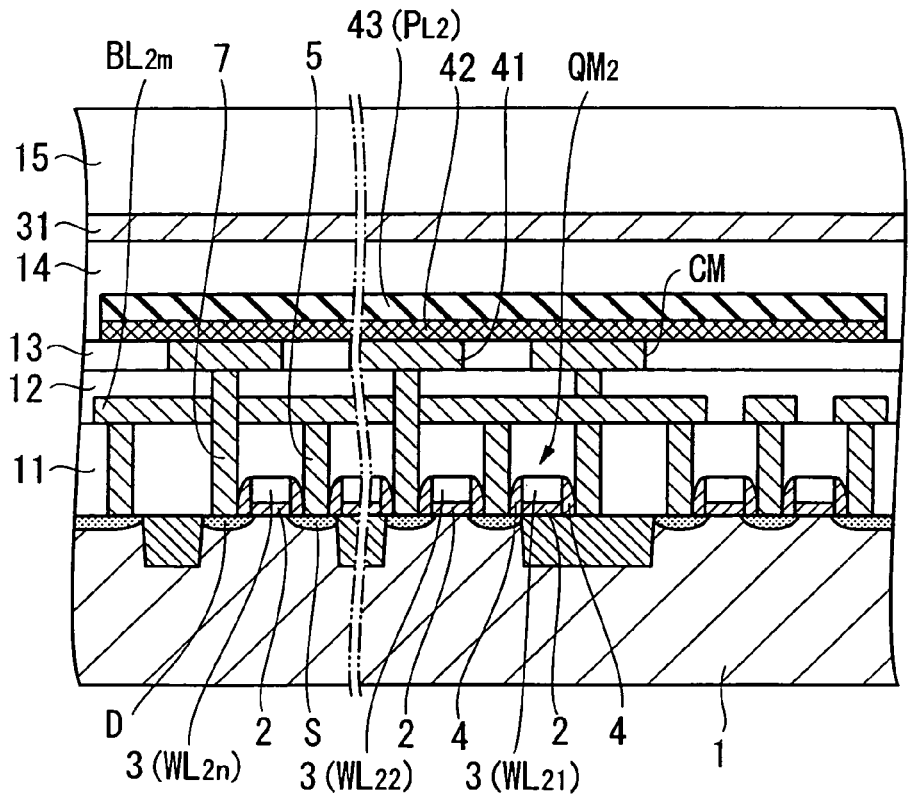

First, a semiconductor memory device and the manufacturing method thereof of a first embodiment shall be described with reference to FIG. 1A to FIG. 6B. FIG 1A and FIG. 1B are circuit diagrams that show the circuit composition of the semiconductor memory device of this embodiment, and FIG. 2A and FIG. 2B are partial sectional drawings showing the main portions of the semiconductor memory device of the present embodiment. Also, FIG. 3A to FIG. 6B are process drawings for describing the method of manufacturing the semiconductor memory device shown in FIG. 2A and FIG. 2B.

(Semiconductor Memory Device)

FIG. 1A is an equivalent circuit drawing of a group of non-volatile semiconductor memory elements, and FIG. 1B is an equivalent circuit drawing of a group of volatile semiconductor memory elements that are provided in the semiconductor memory device of the present embodiment.

As shown in FIG. 1A, the group of non-volatile semiconductor memory elements is basically constituted from n×m non-volatile semiconductor memory elements MCN11 to MCNnm, n word lines WL11 to WL1$n$, m bit lines BL11 to BL1$m$, and m common plate lines PL1.

The non-volatile semiconductor memory elements MCN11 to MCNnm are basically constituted from a selection transistor QM1 and a variable resistance element RM that is connected to the selection transistor QM1. Then, for example in the semiconductor memory element MCN11, the gate electrode of the section transistor QM1 is connected to the world line WL11, and the source electrode is connected to the bit line BL11, and the drain electrode is connected to one electrode (first electrode) of the variable resistance element RM. Also, the other electrode (second electrode) of the variable resistance element RM is connected to the common plate line PL1.

The variable resistance element RM is an element whose resistance value changes depending on the direction of electrical current therethrough, and even in the state of a current not being impressed, that resistance value is maintained. Therefore, it is possible to make it operate as a non-volatile memory element by reading out this resistance value.

On the other hand, as shown in FIG. 1B, the volatile semiconductor memory element group is so-called DRAM, so it is basically constituted from n×m volatile semiconductor memory elements MCD11 to MCDnm, n word lines WL21 to WL2$n$, m bit lines BL21 to BL2$m$, and m common plate lines PL2.

The volatile semiconductor memory elements MCD11 to MCDnm are basically constituted from a selection transistor QM2 (a separate selection transistor) and a capacitance element CM that is connected to the selection transistor QM2.

For example, in the semiconductor memory element MCD11, the gate electrode of the selection transistor QM2 is connected to the word line WL21, the source electrode is connected to the bit line BL21, and the drain electrode is connected to one electrode (the third electrode) of the capacitance element CM. Also, the other electrode (the fourth electrode) of the capacitance element CM is connected to the common plate line PL2.

The capacitance element CM is an element that is capable of retaining any electric charge, and so it is possible to make it operate as a volatile memory element by reading out the existence of an electrical charge.

Next, specific structures of the respective memory elements shall be described using the semiconductor memory element MCN1$m$ and the semiconductor memory element MCD1$m$ as examples and referring to FIG. 2A and FIG. 2B. FIG. 2A shows a sectional frame format of the non-volatile semiconductor memory element MCN1$m$, and FIG. 2B is a sectional schematic view of the volatile semiconductor memory element MCD1$m$.

In FIG. 2A, gate electrodes 3 that consist of polysilicon or the like are formed on a semiconductor substrate 1 that consists of, for example, single crystal silicon via a gate insulating film 2 that consists of silicon oxide. The gate electrodes 3 are formed by extending a portion of the word lines WL11 to WL1$n$. A sidewall 4 consisting of silicon nitride or the like is formed on both sides of each gate electrode 3. A source region S and a drain region D in which an impurity element is diffused are formed in the semiconductor substrate 1 to be positioned on both sides of each gate electrode 3. The source region S is connected to the bit line BL1$m$ through a bit line contact plug 5, and, on the other hand, the drain region D is connected to the variable resistance element RM via a resistance contact plug 6. The bit line contact plug 5 and the resistance contact plug 6 are for example made of a metal, such as tungsten. In this way, the section transistor QM1 is constituted.

Moreover, a first interlayer insulation film 11 that consists of silicon oxide or the like is formed on the semiconductor substrate 1, so that the gate electrode 3 is covered with the first interlayer insulation film 11. Also, the bit line BL consisting of Al, Cu or the like is formed on the first interlayer insulating film 11. And the bit line contact plug 5 that connects the bit line BL1m and the source region S is formed so as to penetrate the first interlayer insulating film 11. Furthermore, a second interlayer insulating film 12 is laminated on the first interlayer insulating film 11 and the bit line BL1m.

Next, the variable resistance element RM is constituted by a first electrode 21 that is connected to the selection transistor QM1 via a resistance contact plug 6, a variable resistance layer 22 that connects to the first electrode 21, and a second electrode 23 that connects to the variable resistance layer 22 that are laminated one by one. The first electrode 21 is formed on the second interlayer insulation film 12, and the resistance contact plug 6 is connected to this first electrode 21. The resistance contact plug 6 penetrates the first interlayer insulating film 11 and the second interlayer insulating film 12 to be connected to the drain region D. Thus, the drain region D of selection transistor QM1 is connected to the first electrode 21. Moreover, the third interlayer insulation film 13 is laminated on the second interlayer insulating film 12, and so the upper surface of the first electrode and the upper surface of the third interlayer insulation film 13 form a continuous flat surface. Then, a variable resistance layer 22 and a second electrode 23 are laminated on this flat surface. Furthermore, a fourth interlayer insulating film 14 that consists of silicon oxide or the like, a wiring layer 31, and a fifth interlayer insulating film 15 are laminated one by one on the second electrode 23.

The first electrode 21 is formed with silver, copper, zinc, or the like, and is preferably formed with copper. On the other hand, the second electrode 23 is formed with tungsten, titanium, platinum, gold, or the like, being preferably formed with tungsten, and constitutes a portion of the common plate line PL1. Moreover, the variable resistance layer 22 consists of any one or a mixture of a transition metal oxide, an aluminum oxide, and a silicone oxide, with a transition metal oxide being particularly preferable. Examples of a transition metal oxide include tantalum oxide, niobium oxide, hafnium oxide, and zirconium oxide either singly or in combination, with hafnium oxide being particularly preferable.

The transition metal oxide or the like that constitutes the variable resistance layer 22 as described below can retain a conductive filament inside, and so by sandwiching this variable resistance layer 22 between the first electrode 21 and the second electrode 23, it is possible to make it function as the variable resistance element RM.

Next, the volatile semiconductor memory element MCD11 shall be described with reference to FIG. 2B. Similarly to FIG. 2A, the gate electrodes 3 are formed on the semiconductor substrate 1 via the gate insulating film 2, the sidewall 4 is formed on both sides of each gate electrode 3, and the source region S and the drain region D are formed in the semiconductor substrate 1 at locations on both sides of the gate electrode 3. The source region S is connected to a bit line BL2m through the bit line contact plug 5, while the drain region D is connected to the capacitance element CM via the capacitance contact plug 7. The bit line contact plug 5 and the capacitance contact plug 7 are, for example, constituted from a metal such as tungsten. Thus, the separate selection transistor QM2 is constituted.

Also, the first interlayer insulating film 11 is formed on the semiconductor substrate 1 so as to cover the gate electrodes 3, and the bit line BL2m is formed on the first interlayer insulating film 11. Then, the bit line contact plug 5 that connects the bit line BL2m and the source region S is formed so as to penetrate the first interlayer insulating film 11. Furthermore, the second interlayer insulating film 12 is laminated on the first interlayer insulating film 11 and the bit line BL2m.

Next, the capacitance element CM is constituted by a third electrode 41 that is connected to the separate selection transistor QM2 through the capacitance contact plug 7, a dielectric layer 42 that connects to the third electrode 41, and a fourth electrode 43 that connects to the dielectric layer 42 that are laminated one by one. The third electrode 41 is formed on the second interlayer insulation film 12, and the capacitance contact plug 7 is connected to this third electrode 41. The capacitance contact plug 7 penetrates the first interlayer insulating film 11 and the second interlayer insulating film 12 to be connected to drain region D. Thus, the drain region D of the separate selection transistor QM2 is connected to the third electrode 41. Moreover, the third interlayer insulating film 13 is laminated on the second interlayer insulating film 12, and so the upper surface of the third electrode 41 and the upper surface of the third interlayer insulating film 13 form a continuous flat surface. Then, a dielectric layer 42 and a fourth electrode 43 are laminated on this flat surface. Furthermore, the fourth interlayer insulating film 14, the wiring layer 31, and the fifth interlayer insulating film 15 are laminated one by one on the fourth electrode 43.

The third electrode 41 and the fourth electrode 43 consist of the same material as the second electrode 23, being for example formed with tungsten. The fourth electrode 43 constitutes a portion of the common plate line PL2. Moreover, the dielectric layer 42 consists of the same material as the variable resistance layer 22, consisting of any one or a mixture of a transition metal oxide, an aluminum oxide, and a silicone oxide, with a transition metal oxide being particularly preferable. Examples of a transition metal oxide include tantalum oxide, niobium oxide, hafnium oxide, and zirconium oxide either singly or in combination, with hafnium oxide being particularly preferable.

Since the transition metal oxide or the like that constitutes the dielectric layer 42 is a material that has a high dielectric constant, by sandwiching this dielectric layer 42 between the third electrode 41 and the fourth electrode 43, it is possible to make it function as a capacitor (capacitance element CM).

Next, the operation of the semiconductor memory elements MCN11 to MCNnm and the semiconductor memory elements MCD11 to MCDnm shall be described.

First, the non-volatile semiconductor memory elements MCN11 to MCNnm shall be described. When the selection transistor QM1 is turned ON and current is flowed from the first electrode 21 to the second electrode 23, the silver, copper, zinc, or the like which constitutes the first electrode 21 is oxidized (ionized) and moves through the second electrode 22 to be reduced and deposited at the second electrode 23 side. Thereby, a conductive filament that penetrates the variable resistance layer 22 is formed by silver or copper and the like between the first electrode 21 and the second electrode 23, and the resistance value of the variable resistance layer 22 decreases. Conversely, when current is passed from the second electrode 23 to the first electrode 21, the conductive filament oxidizes (ionizes) and disappears, and silver or copper and the like is reduced and deposited at the first electrode 21 side. Thus, the conductive filament between the first electrode 21 and the second electrode 23 disappears, and the resistance value of the variable resistance layer 22 increases. Since the resistance value of this variable resistance layer 22 is maintained even in the state where a voltage is not impressed between the first electrode 21 and the second electrode 23, it can be operated as a non-volatile memory cell by reading out this resistance value.

Moreover, high-speed reading and writing on par with DRAM are possible for the variable resistance element RM of the above-mentioned constitution, and its use as non-volatile RAM is also possible.

Next, the volatile semiconductor memory elements MCD11 to MCDnm shall be described. When an electric field is impressed between the third electrode 41 of the capacitance element CM and the fourth electrode 43 by raising the potential of a discretionary word line and bit line to turn ON the selection transistor QM2, the dielectric layer 42 is charged and maintained.

Conversely, when the potential of a discretionary bit line is lowered while maintaining the potential of a word line, the electric charge that was charged to the capacitance element CM is discharged. Since the electrical capacity in this capacitance element CM can be maintained by performing a refresh operation at any time, it can be operated as a volatile memory cell by reading this electrical capacity.

(Method of Manufacturing Semiconductor Memory Device)

Next, a method of manufacturing the abovementioned semiconductor memory device shall be described with reference to the drawings.

The method of manufacturing the semiconductor memory device of the present embodiment consists of a transistor formation process and an element formation process that forms the variable resistance element RM and the capacitance element CM. The method, in the element formation process, involves forming a first electrode dummy electrode and the third electrode with the same material, forming the first electrode with a material that differs from the third electrode after removing the first electrode dummy electrode, forming a dielectric layer and a variable resistance layer, and forming the second electrode and the fourth electrode.

Figure 3A:
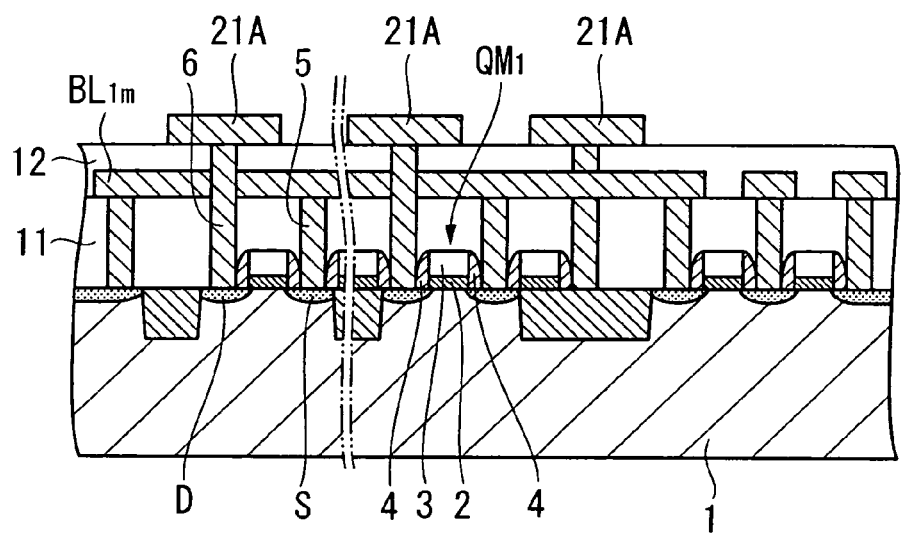
FIGS. 3A and 3B are process drawings for describing the method of manufacturing the semiconductor memory device shown in FIG. 2A and FIG. 2B, specifically being partial sectional drawings that show the formation process of a first electrode dummy electrode and a third electrode.
Figure 3B:
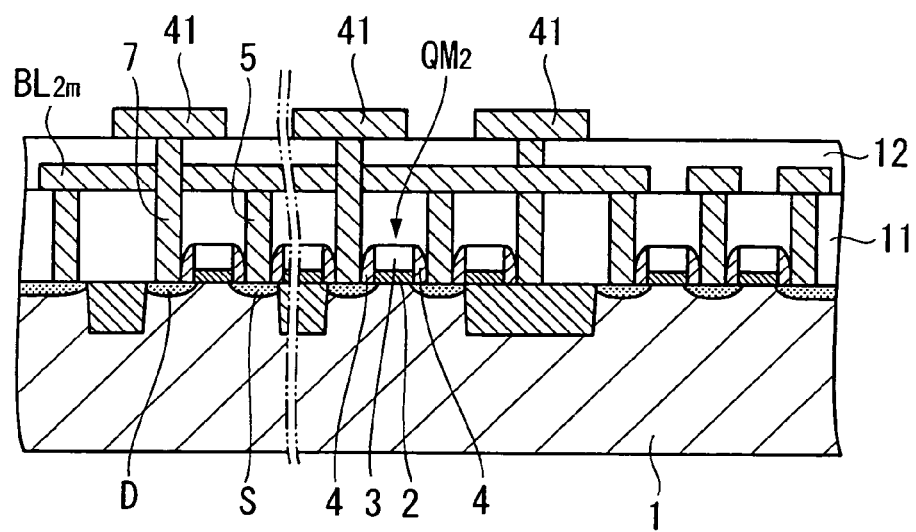
Figure 4A:
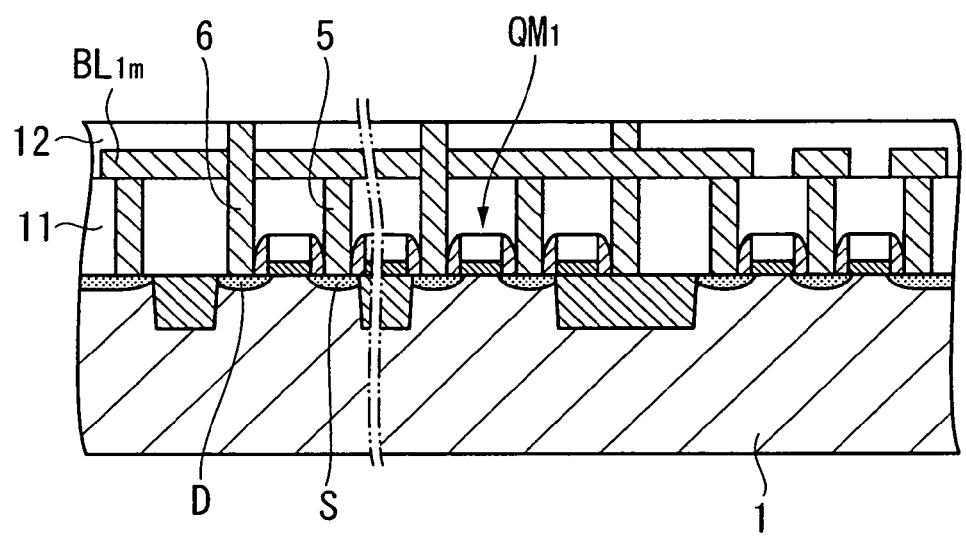
FIGS. 4A and 4B are process drawings for describing the method of manufacturing the semiconductor memory device shown in FIG. 2A and FIG. 2B, specifically being partial sectional drawings that show the process of deleting the first electrode dummy electrode.
Figure 4B:
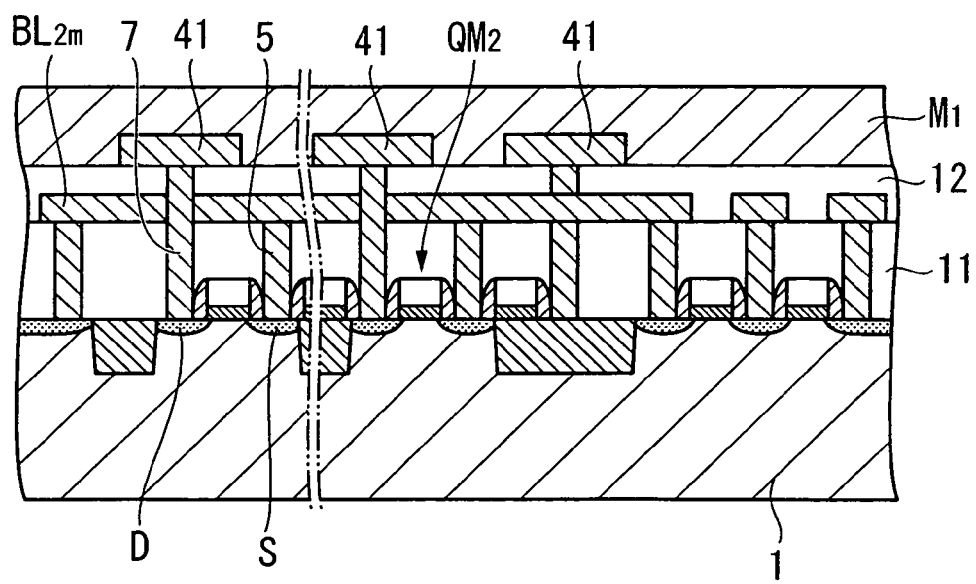
Figure 5A:
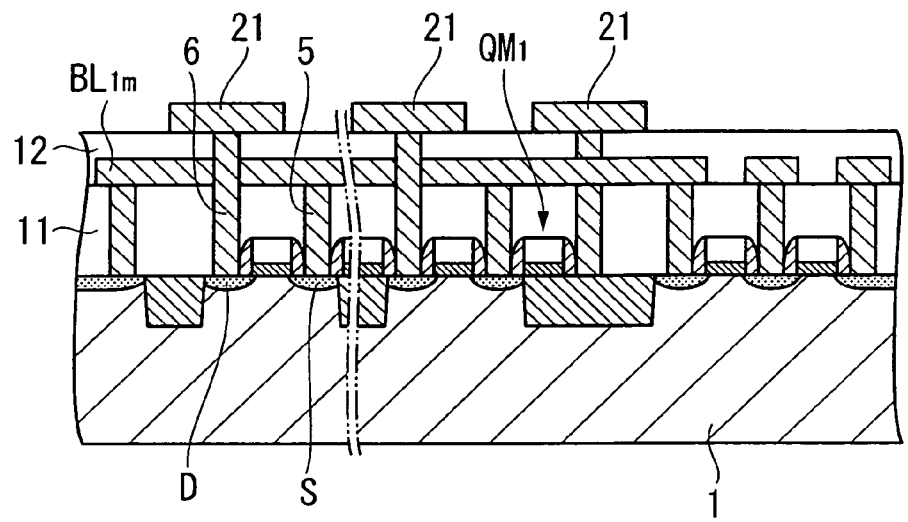
FIGS. 5A and 5B are process drawings for describing the method of manufacturing the semiconductor memory device shown in FIG. 2A and FIG. 2B, specifically being partial sectional drawings that show the formation process of the first electrode.
Figure 5B:
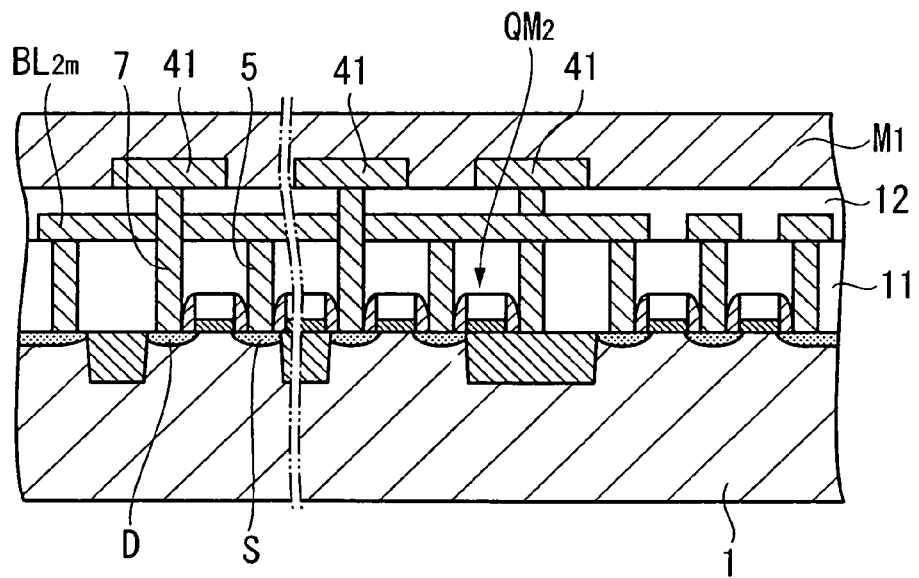
Figure 6A:
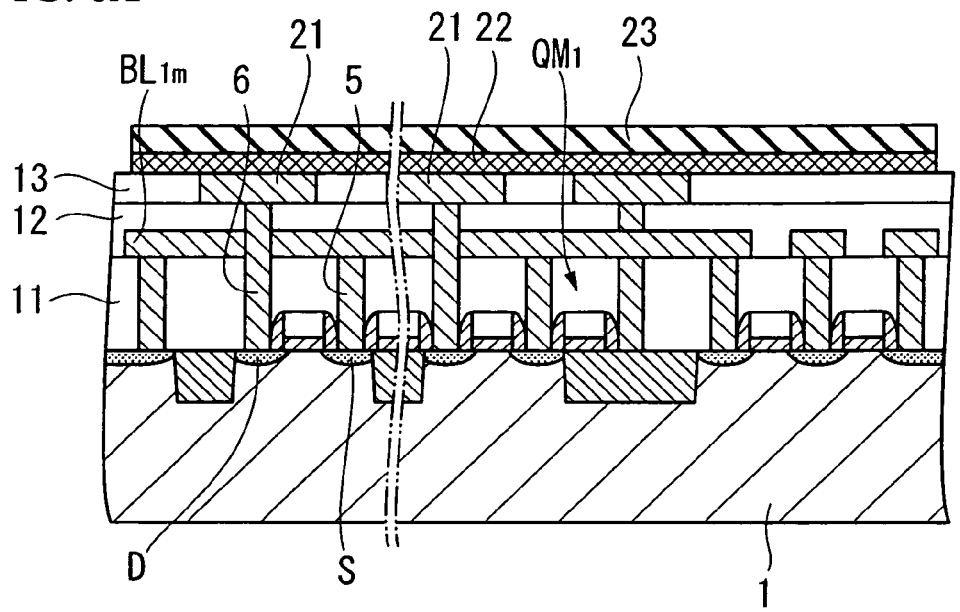
FIGS. 6A and 6B are process drawings for describing the method of manufacturing the semiconductor memory device shown in FIG. 2A and FIG. 2B, specifically being partial sectional drawings that show the formation process of the dielectric layer and variable resistance layer and the second and fourth electrodes.
Figure 6B:
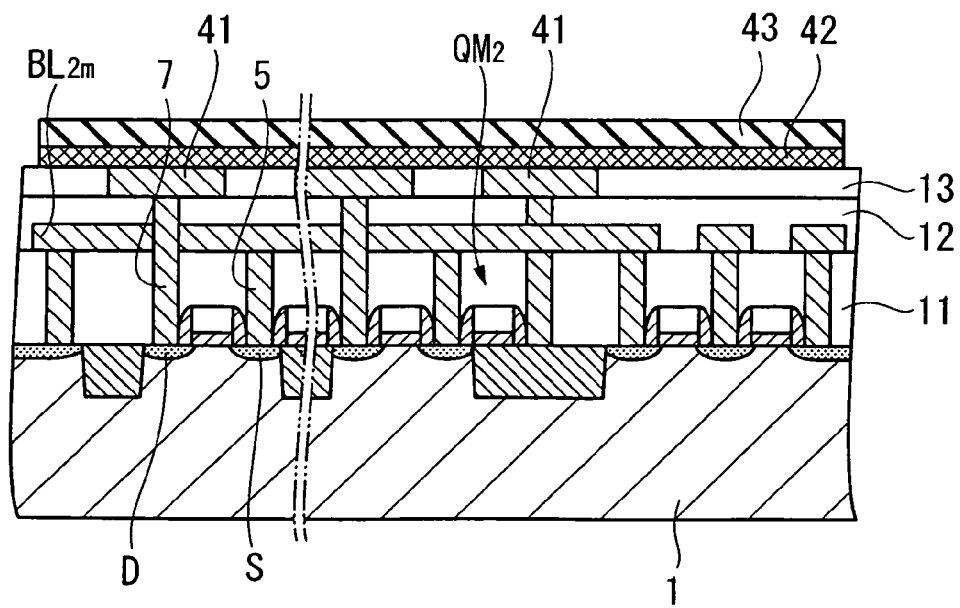

Hereinbelow, FIGS. 3A and 3B to FIGS. 6A and 6B shall be referred to in the description below. FIGS. 3A and 3B are partial sectional drawings that show the formation steps of the first electrode dummy electrode and the third electrode. FIGS. 4A and 4B are partial sectional drawings that show the steps of deleting the first electrode dummy electrode. FIGS. 5A and 5B are partial sectional drawings that show the formation steps of the first electrode. FIGS. 6A and 6B are partial sectional drawings that show the formation steps of the dielectric layer and variable resistance layer and the second and fourth electrodes.

Note that FIGS. 3A to 6A are drawings that correspond to FIG. 2A, while FIGS. 3B to 6B are drawings that correspond to FIG. 2B. The same applies to the other embodiments.

Transistor Formation Process

First, the selection transistor and the separate selection transistor are formed on the semiconductor substrate as shown in FIG. 3A and FIG. 3B.

In describing the outline of the transistor formation process, first the gate insulating film 2 is formed on the semiconductor substrate 1 by for example a thermal oxidation method or the like, the gate electrode 3 and a sidewalls 4 are formed on the gate insulating film 2, and next the source region S and the drain region D are formed by diffusing an impurity in the semiconductor substrate 1 by, for example, an ion infusion method.

Then, the first interlayer insulating film 11 is formed on the semiconductor substrate 1, and a through-hole for the bit line contact plug is formed in the first interlayer insulation film 11. Thereby, the source region S is exposed. Next, tungsten or the like is filled in the through-hole via for example the sputtering method to form the bit line contact plug 5 connected to the source region S. Furthermore, the bit lines BL1m and BL2m that are connected to the bit line contact plug 5 are formed on the first interlayer insulation film 11.

Then, the second interlayer insulating film 12 is formed on bit lines BL1m, BL2m and the first interlayer insulation film 11, and by forming a through-hole for the resistance contact plug 6 and a through-hole for the capacitance contact plug 7, the drain region D is exposed. Next, by filling tungsten or the like in each through-hole by, for example, the sputtering method or the like, the resistance contact plug 6 and the capacitance contact plug 7 that are respectively connected to the drain region D are formed. Thus, the selection transistor QM1 and the separate selection transistor QM2 are formed on the semiconductor substrate 1.

Element Formation Process

Then, the variable resistance element RM and the capacitance element CM are formed.

First, as shown in FIG. 3A, first electrode dummy electrode 21A is formed on the resistance contact plugs 6, and as shown in FIG. 3B, the third electrode 41 is formed on the capacitance contact plugs 7. Specifically, a tungsten film is formed by the sputtering method over the entire surface of the second interlayer insulation film 12, and by patterning the tungsten film by photolithography, the first electrode dummy electrode 21A and the third electrodes 41 are formed simultaneously.

Next, as shown in FIG. 4A, by removing the first electrode dummy electrode 21A by a means such as etching or the like, the resistance contact plug 6 is exposed on the second interlayer insulation film 12. Specifically, for example as shown in FIG. 4B, after protecting the third electrode 41 by laminating a mask layer M1 on the formation region of the third electrode 41, etching processing is performed to remove the first electrode dummy electrode 21A as shown in FIG. 4A.

Next, as shown in FIG. 5A, the first electrode 21 is formed on the resistance contact plug 6. Specifically, a metal film such as silver, copper, or zinc and the like is formed over the entire surface of the second interlayer insulation film 12 by the sputtering method, and by patterning the formed metal film by photolithography, the first electrode 21 is formed on the resistance contact plug 6. In the meantime, by laminating the mask layer M1 as shown in FIG. 5B in the formation region of the third electrode 41, the third electrode 41 is protected.

Next, as shown in FIGS. 6A and 6B, after removing the mask layer M1, the dielectric layer 42 and the variable resistance layer 22, and the second electrode 23 and the fourth electrode 43 are formed one by one. Specifically, as shown in FIGS. 6A and 6B, the third interlayer insulating film 13 is laminated so as to cover the second interlayer insulation film 12, and the first electrode 21 and third electrode 41, and in addition to performing CMP processing to make the third interlayer insulating film 13 flat, the upper surface of the first electrode 21 and the third electrode 41 are exposed. At this time, the upper surface of the third interlayer insulation film 13 and the upper surfaces of the first electrode 21 and third electrode 41 may be flattened so as to be an identical flatness.

Next, as shown in FIGS. 6A and 6B, a compound layer consisting of any one or a mixture of a transition metal oxide, an aluminum oxide, and a silicone oxide is laminated respectively on the third interlayer insulation film 13, and the first electrode 21 and third electrode 41. The compound layer laminated on the first electrode 21 becomes the variable resistance layer 22, and the compound layer laminated on the third electrode 41 becomes the dielectric layer 42. Thus, the variable resistance layer 22 and the dielectric layer 42 are formed simultaneously.

Next, as shown in FIGS. 6A and 6B, a tungsten film is formed by the sputtering method on the variable resistance layer 22 and the dielectric layer 42, and by patterning the tungsten film by photolithography, the second electrode 23 and the fourth electrode 43 are simultaneously formed.

Thus, the variable resistance element RM and the capacitance element CM are formed simultaneously.

Finally, by laminating the fourth interlayer insulation film 14, a wiring layer 31, and a fifth interlayer insulation film 15 one by one, the semiconductor memory device shown in FIGS. 2A and 2B is manufactured.

According to the manufacturing method for the above-mentioned semiconductor memory device, in the element formation process of forming the variable resistance element RM and the capacitance element CM, by mutually forming the dielectric layer 42 and the variable resistance layer 22 with the same material, forming the first electrode 21 with a different material from the third electrode 41, and forming the second electrode 23, the third electrode 41, and the fourth electrode 43 with the same material, it is possible to readily form the non-volatile semiconductor memory elements MCN11 to MCNnm and the volatile semiconductor memory elements MCD11 to MCDnm on the same semiconductor substrate 1.

Also, according to the production method of the above-mentioned semiconductor memory device, other than forming the first electrode 21 with a different material from the third electrode 41 and the fourth electrode 43, the process of forming the volatile semiconductor memory elements MCD11 to MCDnm and the process of forming the non-volatile semiconductor memory elements MCN11 to MCNnm are essentially the same. Therefore, it is possible to form these semiconductor memory elements nearly simultaneously.

Also, the production method of the above-mentioned semiconductor memory device is a method that consists of forming the first electrode dummy electrode 21A simultaneously with the same material as the third electrode 41, forming the first electrode 21 with a material different from the third electrode 41 after removing this first electrode dummy electrode 21A, and then forming the dielectric layer 42 and the variable resistance layer 22, and the second electrode 23 and the fourth electrode 43 one by one. Just by adding the series of steps of formation and removal of the first electrode dummy electrode 21A and formation of the first electrode 21, it is possible to readily and with a high integration form the non-volatile semiconductor memory elements MCN11 to MCNnm and the volatile semiconductor memory elements MCD11 to MCDnm on the same semiconductor substrate 1.

[Second Embodiment]

Figure 7A:
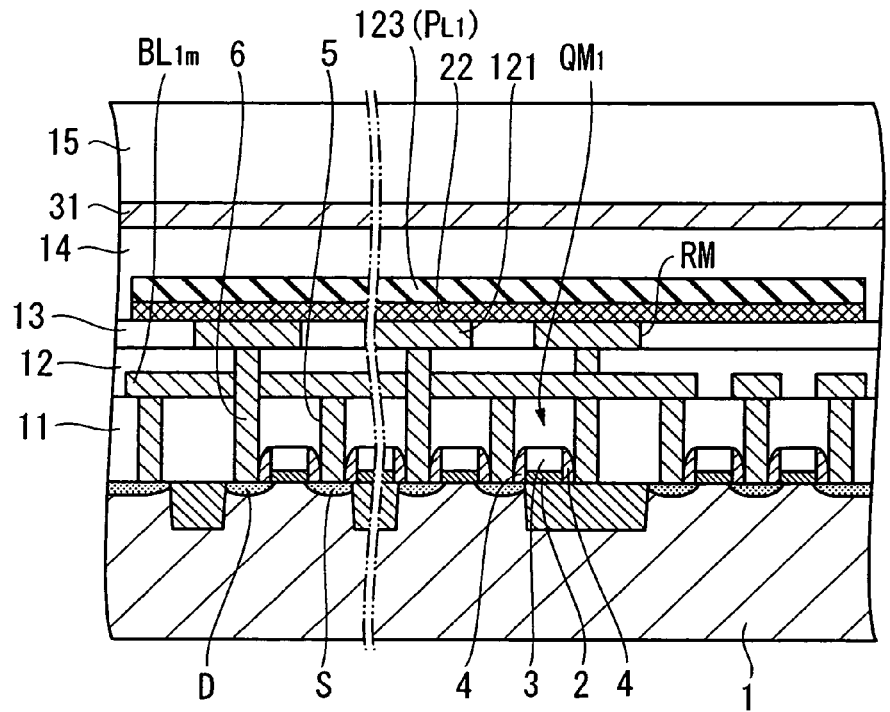
FIGS. 7A and 7B are partial sectional drawings that show the main portions of the semiconductor memory device of the second embodiment of the present invention.
Figure 7B:
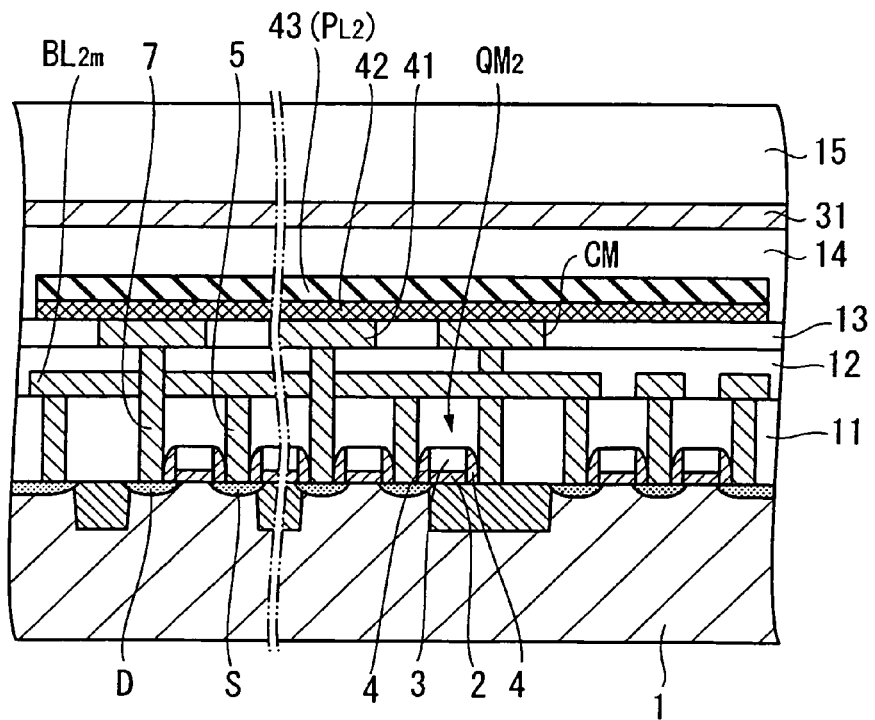

Next, a semiconductor memory device and the manufacturing method thereof of a second embodiment shall be described with reference to FIGS. 7A and 7B to FIGS. 11A and 11B. FIGS. 7A and 7B are partial sectional drawings showing the main portions of the semiconductor memory device of the present embodiment. Also, FIGS. 8A and 8B to FIGS. 11A and 11B are process drawings for describing the method of manufacturing the semiconductor memory device shown in FIGS. 7A and 7B.

The semiconductor memory device of the present embodiment is nearly the same as the semiconductor memory device of the first embodiment, except for the material of the first electrode and the second electrode. Accordingly, among the constituent elements shown in FIGS. 7A and 7B to FIGS. 11A and 11B, the same reference numerals as in FIGS. 2A and 2B to FIGS. 6A and 6B shall be used to designate the constituent elements that are the same as the constituent elements shown in FIGS. 2A and 2B to FIGS. 6A and 6B, with descriptions thereof being omitted or simplified.

(Semiconductor Memory Device)

The semiconductor memory device of the present embodiment is constituted by being provided with a non-volatile semiconductor memory element MCN1m and a volatile semiconductor memory element MCD1m, similarly to the case of the first embodiment. Since the volatile semiconductor memory element MCD1m has the same constitution as in the first embodiment, the description thereof shall be omitted, and the non-volatile semiconductor memory element MCN1m shall be described here.

FIG. 7A is a sectional schematic view of the non-volatile semiconductor memory element MCN1m according to the present embodiment, and FIG. 7B is a sectional schematic view of the volatile semiconductor memory element MCD1m according to the present embodiment.

In FIG. 7A, gate electrodes 3 are formed on the gate insulating film 2 on a semiconductor substrate 1, a sidewall 4 is formed on both sides of each gate electrode 3, and a source region S and a drain region D are formed in the semiconductor substrate 1 on both sides of each gate electrode 3. The source region S is connected to a bit line BL1m via a bit line contact plug 5, and the drain region D is connected to the variable resistance element RM via a resistance contact plug 6. In this way, the section transistor QM1 is constituted.

Moreover, the first interlayer insulation film 11 is formed on the semiconductor substrate 1, and the bit line BL1m is formed on the first interlayer insulation film 11. Also, the bit line contact plug 5 is formed so as to penetrate the first interlayer insulation film 11. Furthermore, the second interlayer insulating film 12 is laminated on the first interlayer insulating film 11 and the bit line BL1m.

Next, the variable resistance element RM is constituted by a first electrode 121, a variable resistance layer 22 that contacts the first electrode 121, and a second electrode 123 that contacts the variable resistance layer 22 being laminated one by one. The first electrode 121 is connected to a drain region D via a resistance contact plug 6. Furthermore, a fourth interlayer insulation film 14 that consists of silicon oxide or the like, a wiring layer 31, and a fifth interlayer insulating film 15 are laminated one by one on the second electrode 123.

The first electrode 121 is formed with tungsten, titanium, gold, platinum, or the like similarly to the third and the fourth electrodes 41 and 43, and is preferably formed with tungsten. Moreover, the second electrode 123 is formed with silver, copper, zinc, or the like, being preferably formed with copper, and constitutes a portion of the common plate line PL1. The variable resistance layer 22 is constituted with the same material as the dielectric layer 42, similarly to the first embodiment. That is, the variable resistance layer 22 consists of any one or a mixture of a transition metal oxide, an aluminum oxide, and a silicone oxide, with a transition metal oxide being particularly preferable. Examples of a transition metal oxide that constitutes the variable resistance layer 22 include tantalum oxide, niobium oxide, hafnium oxide, and zirconium oxide either singly or in combination, with hafnium oxide being preferable.

Next, the operation of the semiconductor memory elements MCN11 to MCNnm shall be described. When the selection transistor QM1 is turned ON and current is flowed from the second electrode 123 of the variable resistance element RM to the first electrode 121, the silver, copper, zinc, or the like which constitutes the second electrode 123 is oxidized (ionized) and moves through the variable resistance layer 22 to be reduced and deposited at the first electrode 121 side. Thereby, a conductive filament that penetrates the variable resistance layer 22 is formed between the first electrode 121 and the second electrode 123, and the resistance value of the variable resistance layer 22 falls. Conversely, when current is passed from the first electrode 121 to the second electrode 123, the conductive filament oxidizes (ionizes) to be reduced and deposited at the second electrode 123 side. Thereby, the conductive filament between the first electrode 121 and the second electrode 123 disappears, and the resistance of the variable resistance layer 22 increases. Since the resistance value of this variable resistance layer 22 is maintained even in the state where a voltage is not impressed between the first electrode 121 and the second electrode 123, it can be operated as a nonvolatile memory cell by reading out this resistance value.

(Method of Manufacturing Semiconductor Memory Device)

Next, a method of manufacturing the abovementioned semiconductor memory device shall be described with reference to the drawings.

The method of manufacturing the semiconductor memory device of the present embodiment consists of a transistor formation process and an element formation process that forms the variable resistance element RM and the capacitance element CM. The method, in the element formation process, consists of simultaneously forming the first electrode 121 and the third electrode 41 with the same material, simultaneously forming the variable resistance layer 22 and the dielectric layer 42 on the first electrode 121 and the third electrode 41, respectively, and next simultaneously forming the second electrode dummy electrode 123A and the fourth electrode 43 on the variable resistance layer 22 and the dielectric layer 42, respectively, with the same material as the first and third electrodes 121, 41, and then forming the second electrode 123 with a material that differs from the first, third and fourth electrodes 121, 41, 43 after removing the second electrode dummy electrode 123A.

Figure 8A:
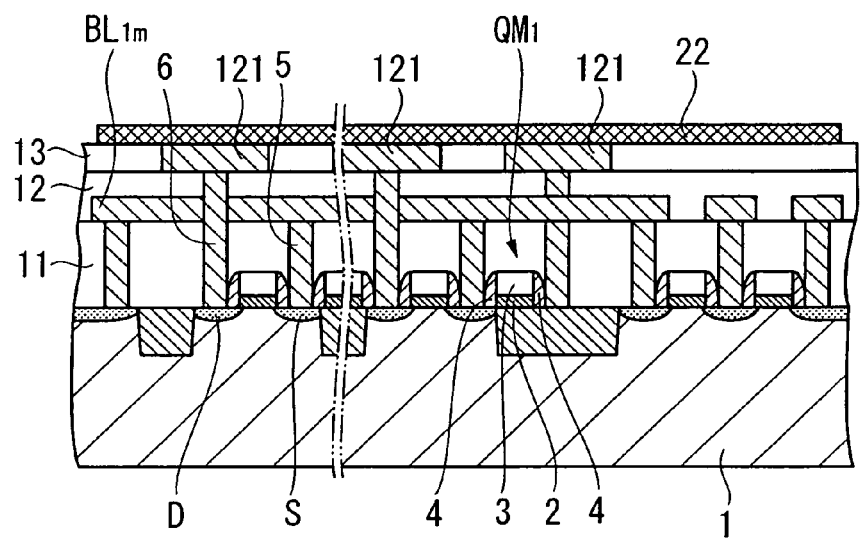
FIGS. 8A and 8B are process drawings for describing the method of manufacturing the semiconductor memory device shown in FIG. 7A and FIG. 7B, specifically being partial sectional drawings that show the formation process of the first electrode and third electrode and the dielectric layer and variable resistance layer.
Figure 8B:
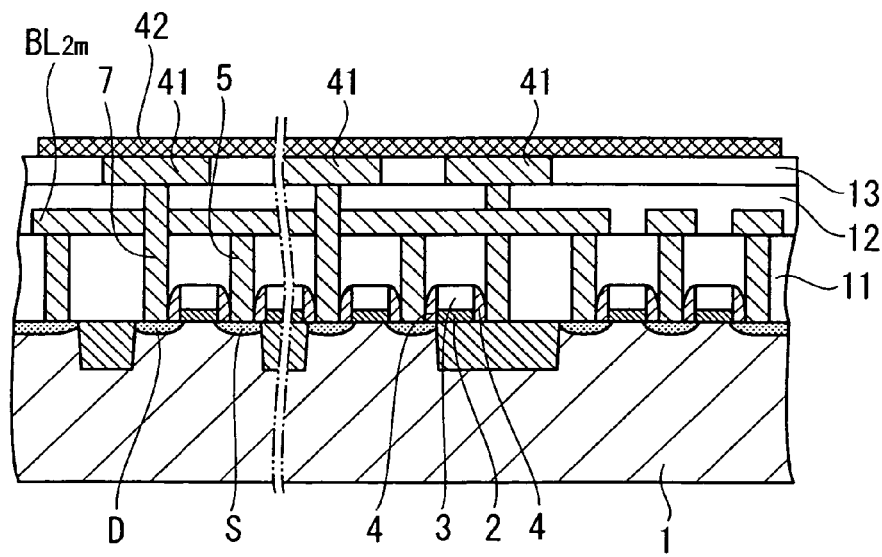
Figure 9A:
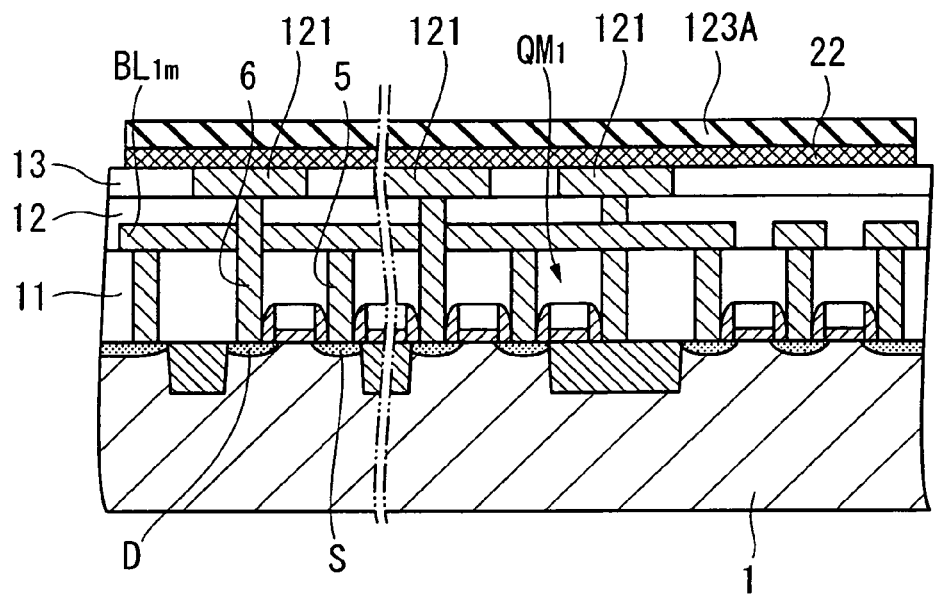
FIGS. 9A and 9B are process drawings for describing the method of manufacturing the semiconductor memory device shown in FIG. 7A and FIG. 7B, specifically being partial sectional drawings that show the formation process of the second electrode dummy electrode and the fourth electrode.
Figure 9B:
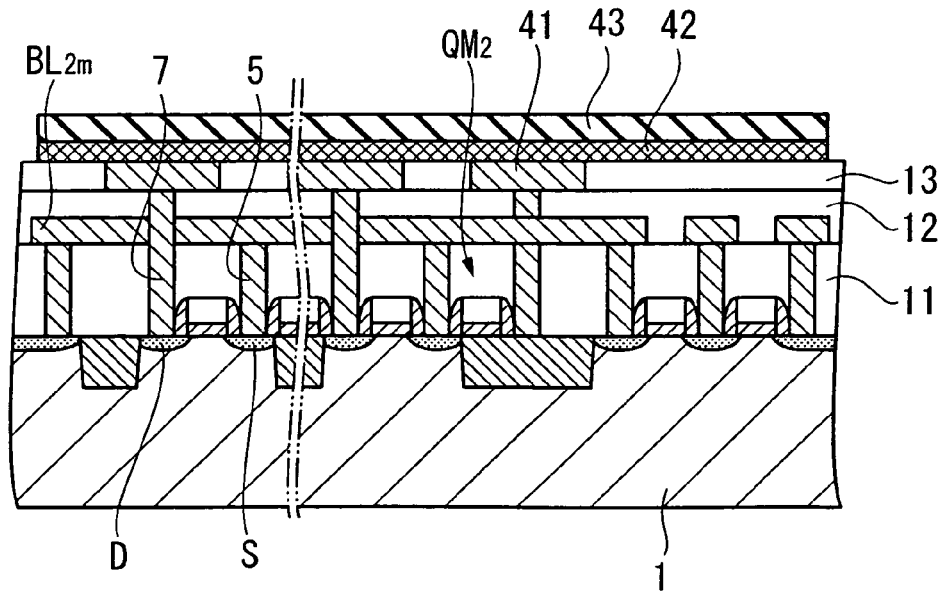
Figure 10A:
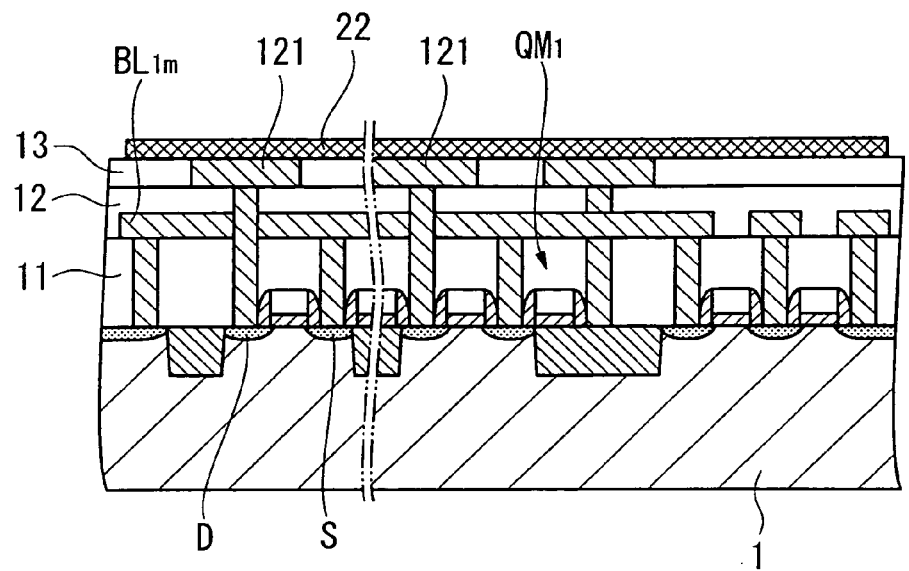
FIGS. 10A and 10B are process drawings for describing the method of manufacturing the semiconductor memory device shown in FIG. 7A and FIG. 7B, specifically being partial sectional drawings that show the process for eliminating the second electrode dummy electrode.
Figure 10B:
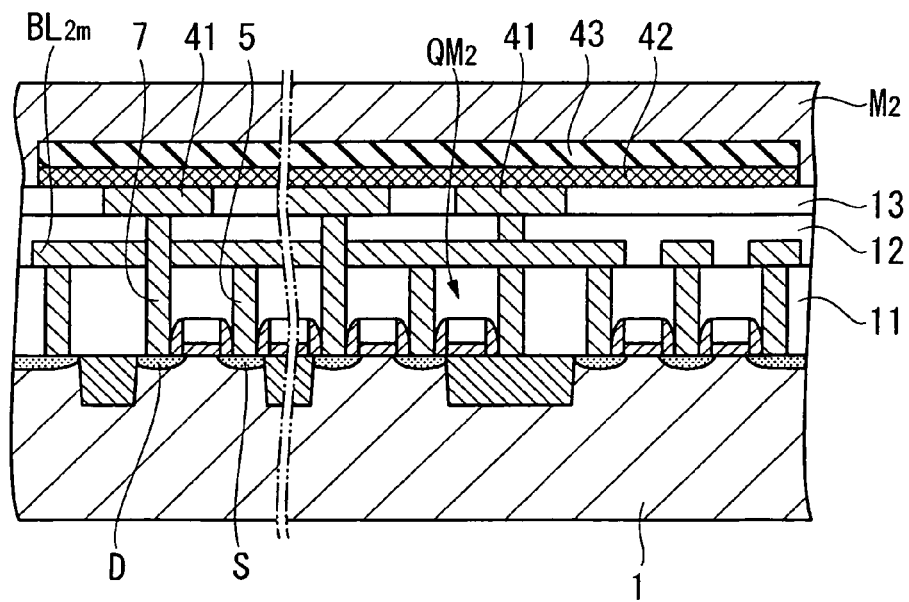
Figure 11A:
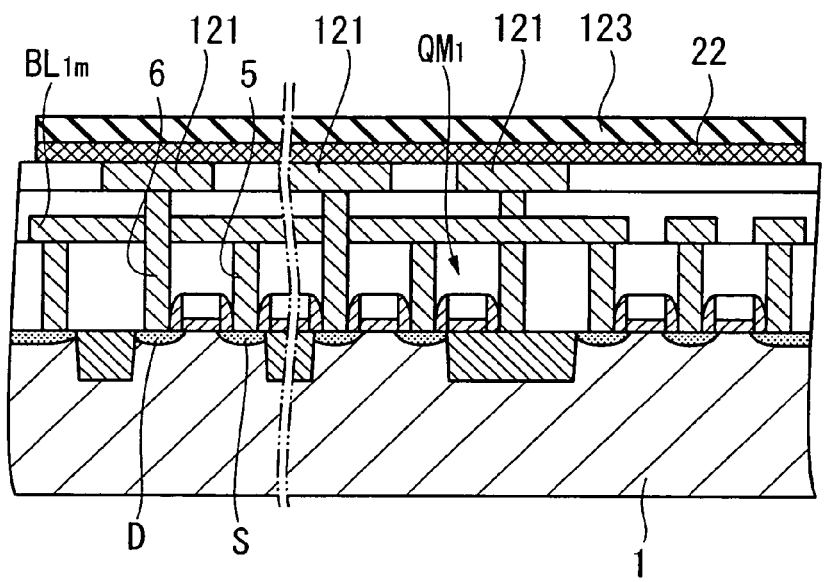
FIGS. 11A and 11B are process drawings for describing the method of manufacturing the semiconductor memory device shown in FIG. 7A and FIG. 7B, specifically being partial sectional drawings that show the formation process of the second electrode.
Figure 11B:
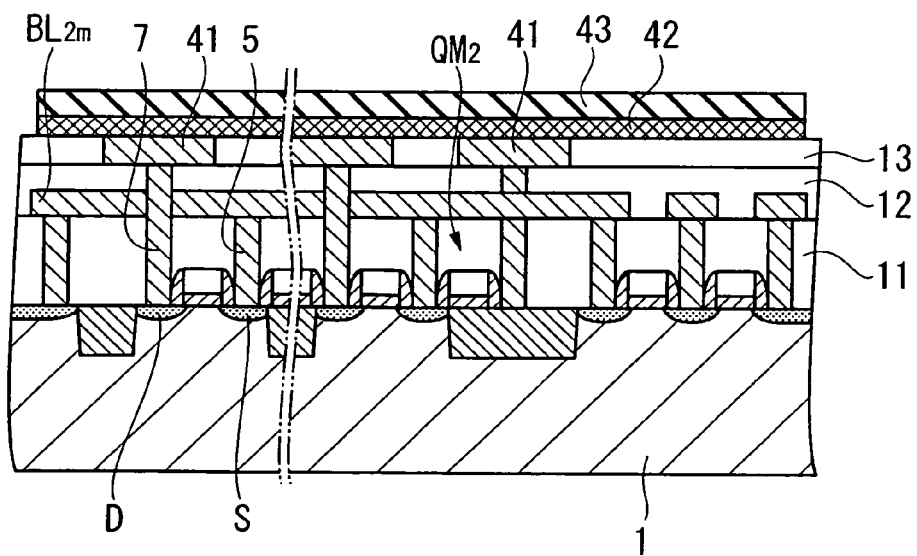

Hereinbelow, the description shall be made with reference to FIGS. 8A and 8B to FIGS. 11A and 11B. FIGS. 8A and 8B are partial sectional drawings that show the formation steps of the first electrode and third electrode and the dielectric layer and variable resistance layer. FIGS. 9A and 9B are partial sectional drawings that show the formation steps of the second electrode dummy electrode and the fourth electrode. FIG. 10A and FIG. 10B are partial sectional drawings that show the steps for eliminating the second electrode dummy electrode. FIG. 11A and FIG. 11B are partial sectional drawings that show the formation process of the second electrode.

Transistor Formation Process

First, as shown in FIG. 8A and FIG. 8B, the selection transistor QM1 and selection transistor QM2 are formed similarly to the case of the first embodiment.

Element Formation Process

Then, the variable resistance element RM and the capacitance element CM are formed.

First, as shown in FIG. 8A, the first electrode 121 is formed on the resistance contact plug 6, and as shown in FIG. 8B, the third electrode 41 is formed on the capacitance contact plug 7. Specifically, a tungsten film for example is formed by the sputtering method over the entire surface of the second interlayer insulation film 12, and by patterning the tungsten film by photolithography, the first electrode 121 and the third electrode 41 are formed simultaneously.

Next, as shown in FIGS. 8A and 8B, the third interlayer insulating film 13 is laminated so as to cover the second interlayer insulating film 12, the first electrode 121, and the third electrode 41, CMP processing is performed to make the third interlayer insulating film 13 flat, and the upper surface of the first electrode 121 and the third electrode 41 are exposed.

Next, as shown in FIGS. 8A and 8B, a compound layer consisting of any one or a mixture of a transition metal oxide, an aluminum oxide, and a silicone oxide is laminated respectively on the third interlayer insulation film 13, and the first electrode 121 and third electrode 41. The compound layer laminated on the first electrode 121 becomes the variable resistance layer 22, and the compound layer laminated on the third electrode 41 becomes the dielectric layer 42. Thus, the variable resistance layer 22 and the dielectric layer 42 are formed simultaneously.

Next, as shown in FIG. 9A, the second electrode dummy electrode 123A is formed on the variable resistance layer 22, and as shown in FIG. 9B, the fourth electrode 43 is formed on the dielectric layer 42.

Specifically a tungsten film for example is formed by the sputtering method over the entire surface of the variable resistance layer 22 and the dielectric layer 42, and by next patterning the tungsten film by photolithography, the second electrode dummy electrode 123A and the fourth electrode 43 are formed simultaneously.

Next, as shown in FIG. 10A, by removing the second electrode dummy electrode 123A by a means such as etching or the like, the variable resistance layer 22 is exposed. As specifically shown for example in FIG. 10B, after laminating a mask layer M2 on the formation region of the fourth electrode 43 to protect the fourth electrode 43, etching processing is performed to remove the second electrode dummy electrode 123A as shown in FIG. 10A.

Next, as shown in FIG. 11A, the second electrode 123 on the variable resistance layer 22. Specifically, a metal film such as silver, copper, or zinc and the like is formed over the entire surface of the variable resistance layer 22 by the sputtering method, and by patterning the formed metal film by photolithography, the second electrode 123 is formed on the variable resistance layer 22. In the meantime, by leaving the mask layer M2 laminated on the formation region of the fourth electrode 43, the fourth electrode 43 is protected. The mask layer M2 may be removed as shown in FIG. 11B as soon as the formation of the second electrode 123 is completed.

Thus, the variable resistance element RM and the capacitance element CM are formed simultaneously.

Finally, by laminating the fourth interlayer insulation film 14, the wiring layer 31, and the fifth interlayer insulation film 15 one by one, the semiconductor memory device shown in FIGS. 7A and 7B is manufactured.

The manufacturing method for the above-mentioned semiconductor memory device is a method of forming the second electrode dummy electrode 123A simultaneously with the fourth electrode 43 and with the same material, and forming the second electrode 123 with a material that differs from the first, third and fourth electrodes 121, 41, 43 after removing the second electrode dummy electrode 123A. Just by adding the series of steps of formation and removal of the second electrode dummy electrode 123A and formation of the second electrode 123, it is possible to readily and with a high integration form the non-volatile semiconductor memory elements MCN11 to MCNnm and the volatile semiconductor memory elements MCD11 to MCDnm on the same semiconductor substrate 1.

[Third Embodiment]

Figure 12A:
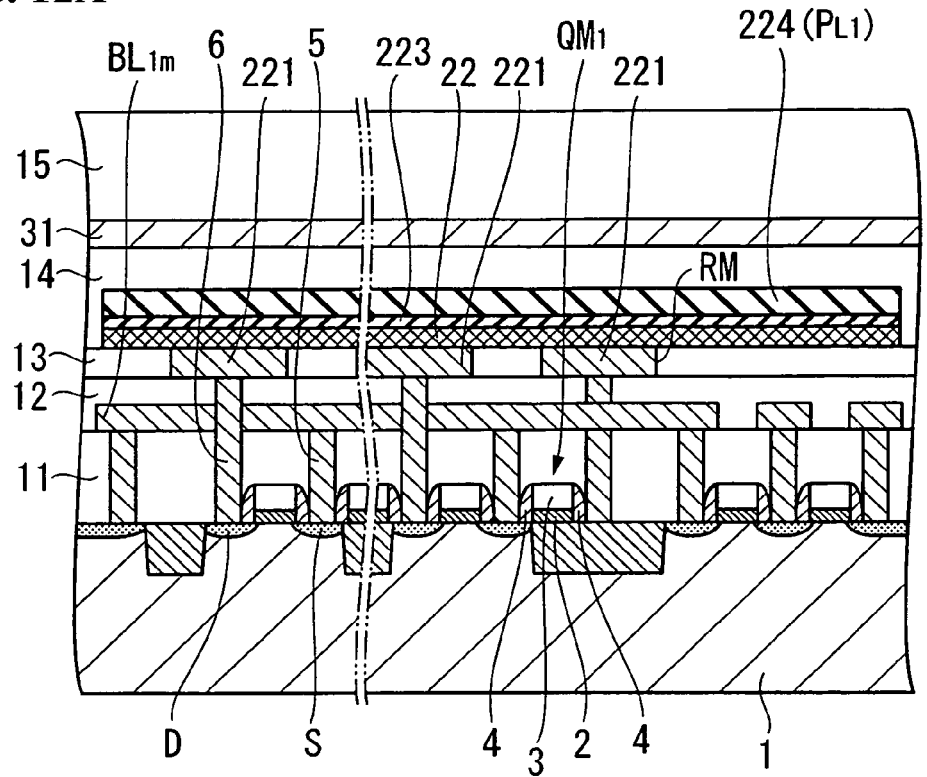
FIGS. 12A and 12B are partial sectional drawings that show the main portions of the semiconductor memory device of the third embodiment of the present invention.
Figure 12B:
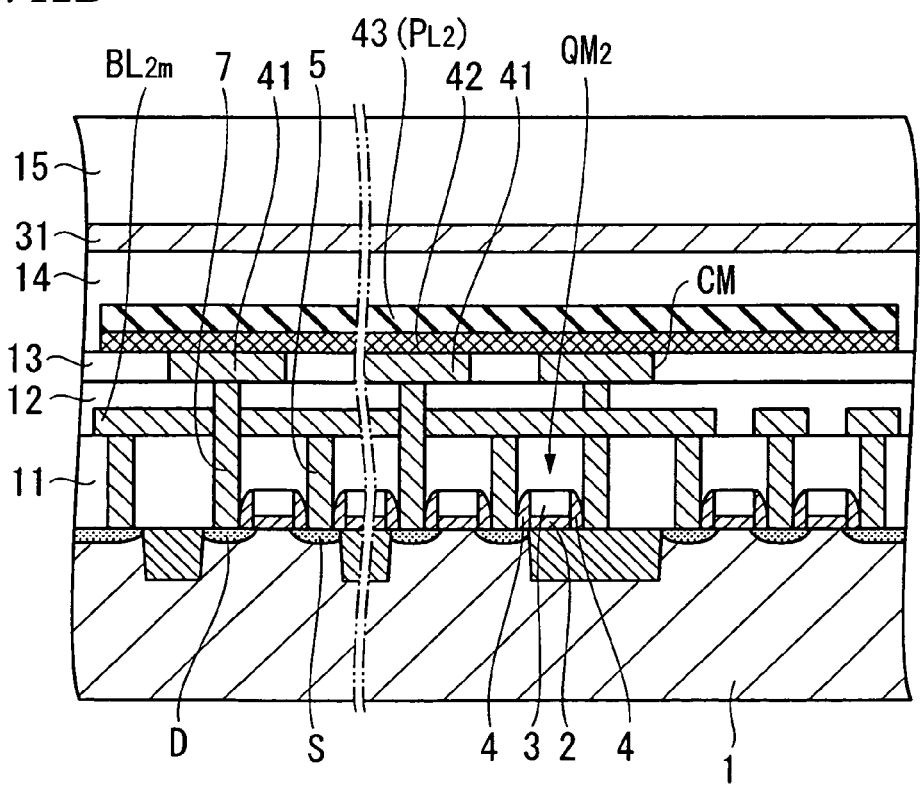

Next, a semiconductor memory device and the manufacturing method thereof of a third embodiment shall be described with reference to FIGS. 12A and 12B to FIGS. 16A and 16B. FIGS. 12A and 12B are partial sectional drawings showing the main portions of the semiconductor memory device of the present embodiment. Also, FIGS. 13A and 13B to FIGS. 16A and 16B are process drawings for describing the method of manufacturing the semiconductor memory device shown in FIGS. 12A and 12B.

(Semiconductor Memory Device)

The semiconductor memory device of the present embodiment is constituted by being provided with a non-volatile semiconductor memory element MCN1$m$ and a volatile semiconductor memory element MCD1$m$, similarly to the case of the first embodiment. Since the volatile semiconductor memory element MCD1$m$ has the same constitution as in the first embodiment, the description thereof shall be omitted, and the non-volatile semiconductor memory element MCN1$m$ shall be described here.

FIG. 12A is a sectional schematic view of the non-volatile semiconductor memory element MCN1$m$ according to the present embodiment, and FIG. 12B is a sectional schematic view of the volatile semiconductor memory element MCD1$m$ according to the present embodiment.

In FIG. 12A, gate electrodes 3 are formed on the gate insulating film 2 on the semiconductor substrate 1, the sidewall 4 is formed on both sides of each gate electrode 3, and the source region S and the drain region D are formed in the semiconductor substrate 1 on both sides of each gate electrode 3. The source region S is connected to the bit line BL1$m$ via the bit line contact plug 5, and the drain region D is connected to the variable resistance element RM via the resistance contact plug 6. In this way, the section transistor QM1 is constituted.

Moreover, the first interlayer insulation film 11 is formed on the semiconductor substrate 1, and the bit line BL1$m$ is formed on the first interlayer insulation film 11. Also, the bit line contact plug 5 is formed so as to penetrate the first interlayer insulation film 11. Furthermore, the second interlayer insulating film 12 is laminated on the first interlayer insulating film 11 and the bit line BL1$m$.

Next, the variable resistance element RM is constituted by a first electrode 221, a variable resistance layer 22 that connects to the first electrode 221, and a second electrode 223 that connects to the variable resistance layer 22 being laminated one by one. The first electrode 221 is connected to a drain region D via a resistance contact plug 6. Furthermore, a plate electrode 224 which consists of tungsten or the like is laminated on the second electrode 223, and this plate electrode 224 constitutes a portion of common plate line PL1. Moreover, the plate electrode 224 is formed simultaneously with the fourth electrode 43 of the volatile semiconductor memory element MCD1$m$ as described below, and it has the almost same thickness as the fourth electrode 43. Then, a fourth interlayer insulation film 14 that consists of silicon oxide or the like, a wiring layer 31, and a fifth interlayer insulating film 15 are laminated one by one on the plate electrode 224. Note that in the volatile semiconductor memory element MCD1$m$, the fourth interlayer insulation film 14 is laminated on the fourth electrode 43.

The first electrode 221 is formed with tungsten or the like similarly to the third electrode 41 and the and the fourth electrode 43 of the volatile semiconductor memory element MCD1$m$. Moreover, the second electrode 223 is formed with silver, copper, zinc, or the like, and is formed thinner than the second electrode in the first and second embodiments. The variable resistance layer 22 is constituted with the same material as the dielectric layer 42, similarly to the first embodiment. That is, the variable resistance layer 22 consists of any one or a mixture of a transition metal oxide, an aluminum oxide, and a silicone oxide, with a transition metal oxide being particularly preferable. Examples of a transition metal oxide that constitutes the variable resistance layer 22 include tantalum oxide, niobium oxide, hafnium oxide, and zirconium oxide either singly or in combination, with hafnium oxide being preferable.

Operation of the semiconductor memory elements MCN11 to MCN$nm$ is the same as that of the case of the second embodiment.

(Method of Manufacturing Semiconductor Memory Device)

Next, a method of manufacturing the abovementioned semiconductor memory device shall be described with reference to the drawings.

The method of manufacturing the semiconductor memory device of the present embodiment consists of a transistor formation process and an element formation process that forms the variable resistance element RM and the capacitance element CM. The method, in the element formation process, involves simultaneously forming the first electrode 221 and the third electrode 41 with the same material, simultaneously forming the variable resistance layer 22 and the dielectric layer 42 on the first electrode 221 and the third electrode 41, respectively, and next simultaneously forming the second electrode 223 and the fourth electrode dummy electrode 43A on the variable resistance layer 22 and the dielectric layer 42, respectively, with a material that differs from the first and third electrodes 121, 41, and then forming the fourth electrode 43 with the same material as the first and third electrodes 221, 41 after removing the fourth electrode dummy electrode 43A.

Figure 13A:
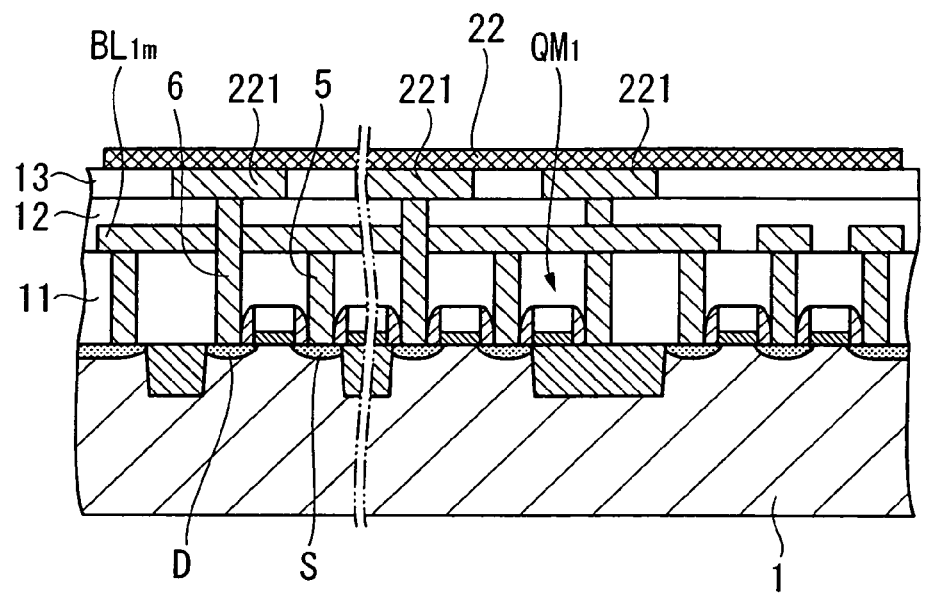
FIGS. 13A and 13B are process drawings for describing the method of manufacturing the semiconductor memory device shown in FIG. 12A and FIG. 12B, specifically being partial sectional drawings that show the formation steps of the first electrode and third electrode and the dielectric layer and variable resistance layer.
Figure 13B:
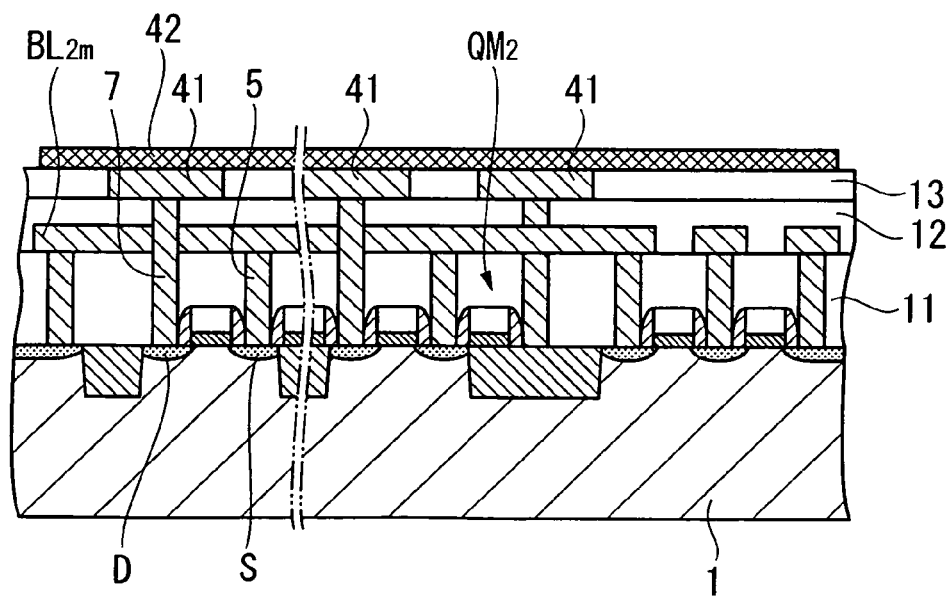
Figure 14A:
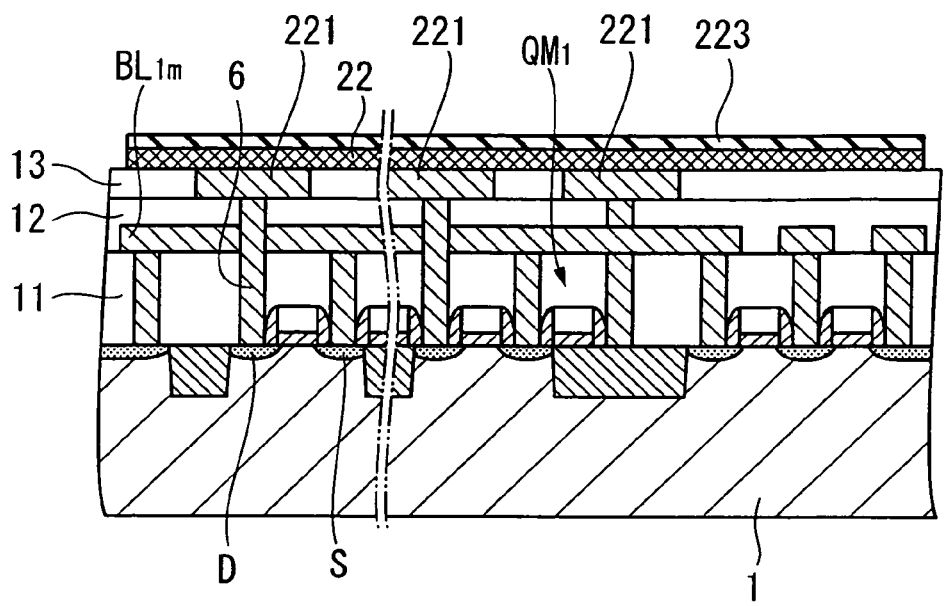
FIGS. 14A and 14B are process drawings for describing the method of manufacturing the semiconductor memory device shown in FIG. 12A and FIG. 12B, specifically being partial sectional drawings that show the formation process of the second electrode and the fourth electrode dummy electrode.
Figure 14B:
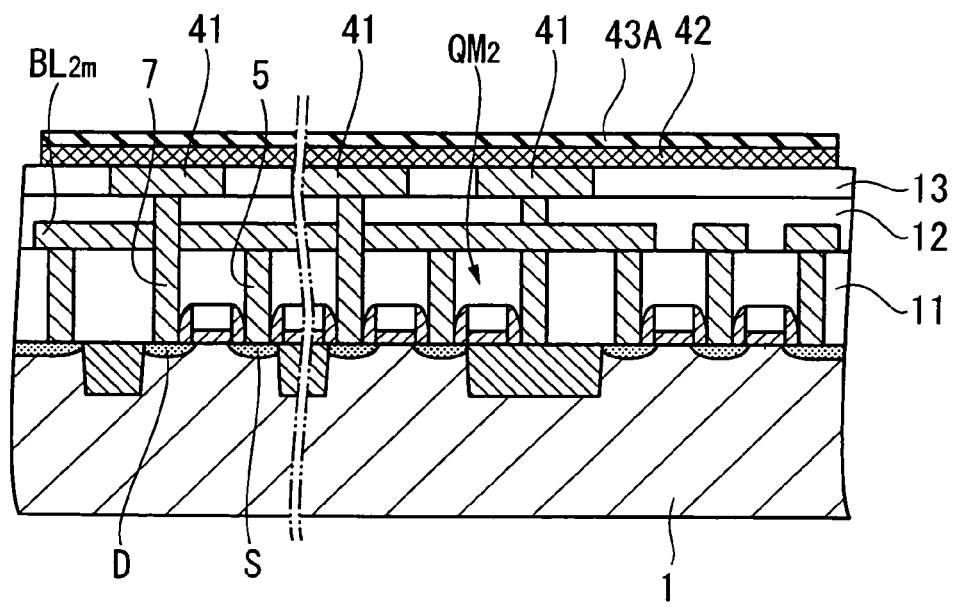
Figure 15A:
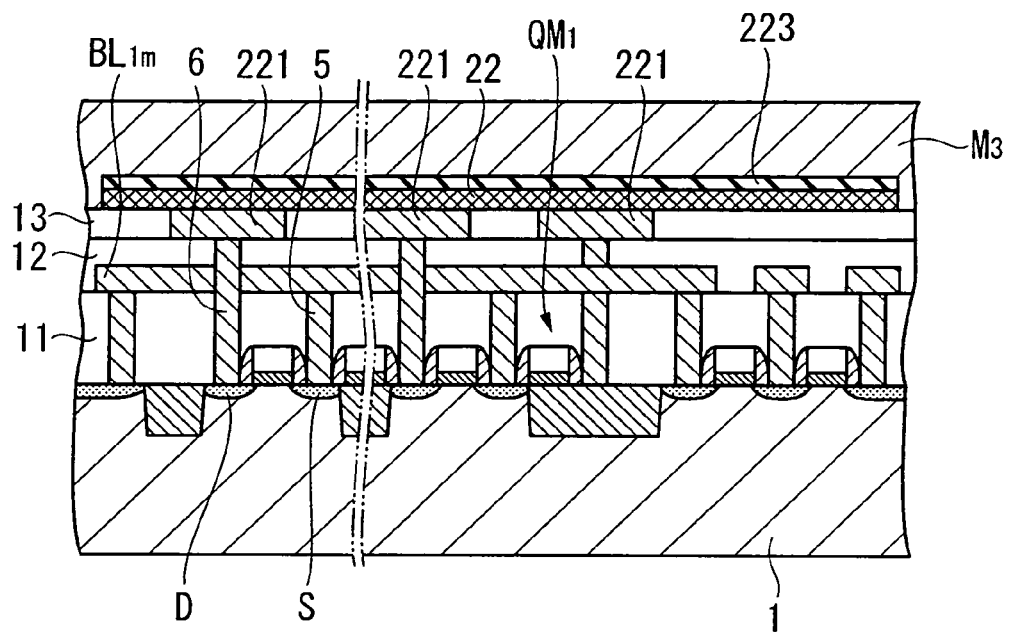
FIGS. 15A and 15B are process drawings for describing the method of manufacturing the semiconductor memory device shown in FIG. 12A and FIG. 12B, specifically being partial sectional drawings that show the process of deleting the fourth electrode dummy electrode.
Figure 15B:
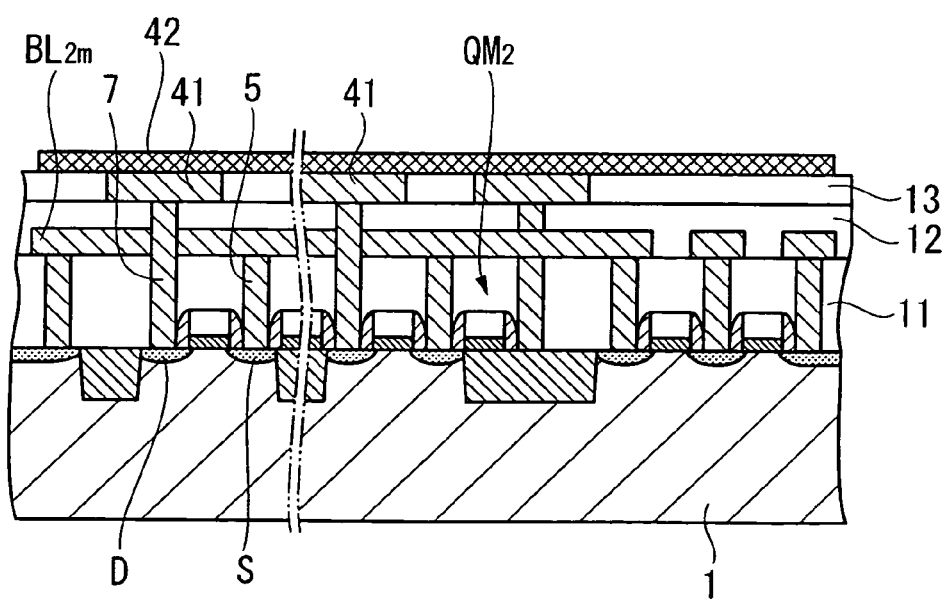
Figure 16A:
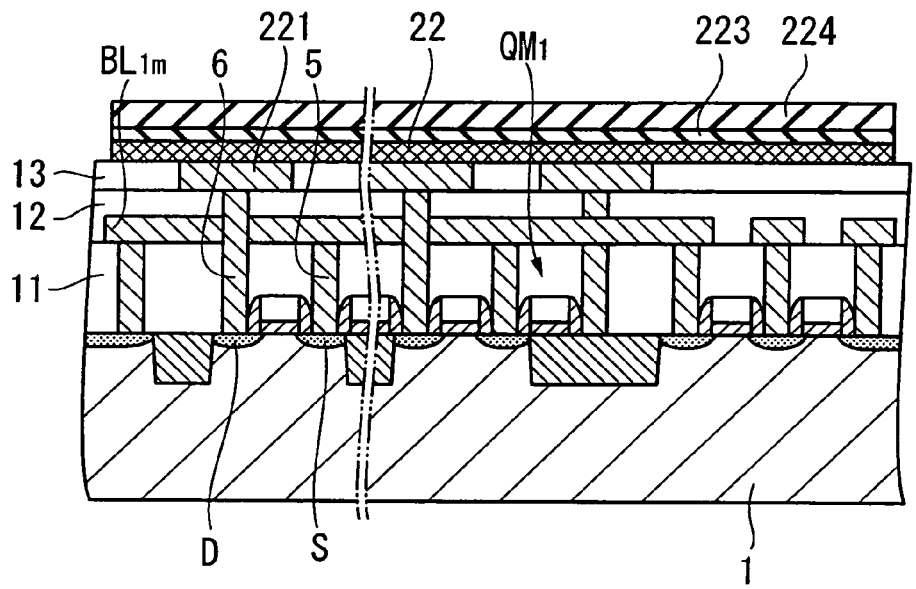
FIGS. 16A and 16B are process drawings for describing the method of manufacturing the semiconductor memory device shown in FIG. 12A and FIG. 12B, specifically being partial sectional drawings that show the formation process of the fourth electrode.
Figure 16B:
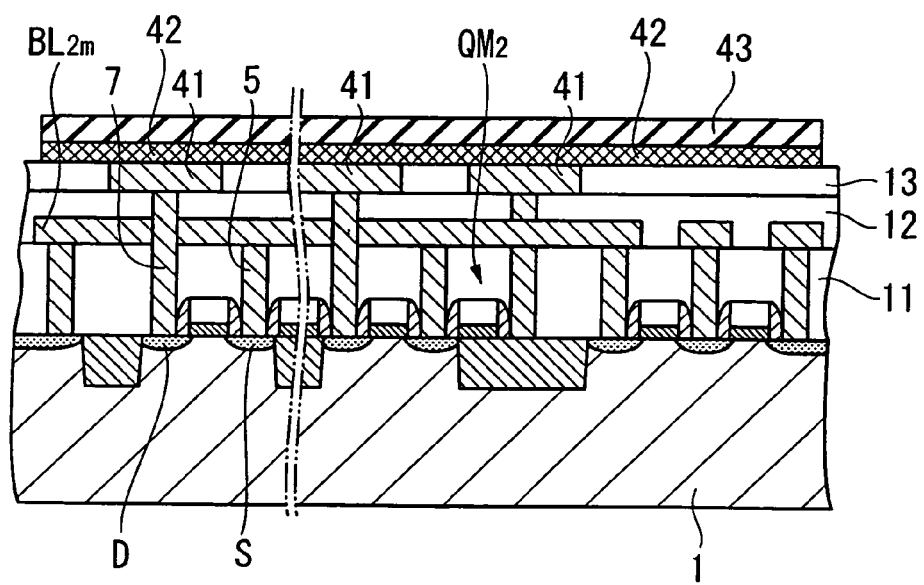

Hereinbelow, FIGS. 13A and 13B to FIGS. 16A and 16B shall be referred to in the description below. FIGS. 13A and 13B are partial sectional drawings that show the formation steps of the first electrode and third electrode and the dielectric layer and variable resistance layer. FIGS. 14A and 14B are partial sectional drawings that show the formation steps of the second electrode and the fourth electrode dummy electrode. FIGS. 15A and 15B are partial sectional drawings that show the steps of deleting the fourth electrode dummy electrode. FIGS. 16A and 16B are partial sectional drawings that show the formation steps of the fourth electrode.

Transistor Formation Process

First, the selection transistor QM1 and the separate selection transistor QM2 are formed as shown in FIG. 13A and FIG. 13B, similarly to the case of the first and second embodiments.

Element Formation Process

Then, the variable resistance element RM and the capacitance element CM are formed.

First, as shown in FIG. 13A, a first electrode 221 is formed on the resistance contact plug 6, and as shown in FIG. 13B, the third electrode 41 is formed on the capacitance contact plug 7. Specifically, a tungsten film is formed by the sputtering method over the entire surface of the second interlayer insulation film 12, and by patterning the tungsten film by photolithography, the first electrode 221 and the third electrode 41 are formed simultaneously.

Next, the third interlayer insulating film 13 is laminated so as to cover the first electrode 221 and the third electrode 41, the third interlayer insulating film 13 is subjected to CMP processing to make it flat, and the upper surface of the first electrode 221 and the third electrode 41 are exposed. Then, a compound layer consisting of any one or a mixture of a transition metal oxide, an aluminum oxide, and a silicone oxide is laminated on the third interlayer insulation film 13, and the first electrode 221 and third electrode 41. The compound layer laminated on the first electrode 221 becomes the variable resistance layer 22, and the compound layer laminated on the third electrode 41 becomes the dielectric layer 42. Thus, as shown in FIGS. 13A and 13B, the variable resistance layer 22 and the dielectric layer 42 are formed simultaneously.

Next, as shown in FIGS. 14A and 14B, the second electrode 223 and the fourth electrode dummy electrode 43A are formed simultaneously on the variable resistance layer 22 and the dielectric layer 42, respectively. Specifically, a metal film such as silver, copper, or zinc and the like is formed over the entire surface of the variable resistance layer 22 and the dielectric layer 42 by the sputtering method, and next by patterning the formed metal film by photolithography, a second electrode 223 and a fourth electrode dummy electrode 43A consisting of silver, copper, zinc and the like are formed simultaneously.

Next, as shown in FIG. 15B, the dielectric layer 42 is exposed by removing the fourth electrode dummy electrode 43A with a means such as etching. Specifically, for example as shown in FIG. 15A, after protecting the second electrode 223 by laminating a mask layer M3 on the formation region of the second electrode 223, the fourth electrode dummy electrode 43A is removed by performing etching processing until the dielectric layer 42 is exposed as shown in FIG. 15B.

Next, as shown in FIGS. 16A and 16B, a plate electrode 224 and the fourth electrode 43 are simultaneously formed on the second electrode 223 and the dielectric layer 42. Specifically, the mask layer M3 is removed to expose the second electrode 223. Next, a metal film consisting of tungsten or the like is formed by the sputtering method on the second electrode 223 and the dielectric layer 42, and by next patterning the formed metal film by photolithography, the plate electrode 224 and the fourth electrode 43 each consisting of tungsten or the like are simultaneously formed.

Thus, the variable resistance element RM and the capacitance element CM are formed simultaneously.

Finally, by laminating the fourth interlayer insulation film 14, the wiring layer 31, and the fifth interlayer insulation film 15 one by one on the plate electrode 224 and the fourth electrode 43, the semiconductor memory device shown in FIGS. 12A and 12B is manufactured.

The manufacturing method for the above-mentioned semiconductor memory device is a method of simultaneously forming the fourth electrode dummy electrode 43A with a material that differs from the first electrode 221 and the third electrode 41, and forming the fourth electrode 43 with the same material as the first electrode 221 and the third electrode 41 after removing the fourth electrode dummy electrode 43A. Just by adding the series of steps of formation and removal of the fourth electrode dummy electrode 43A and formation of the fourth electrode 43, it is possible to readily and with a high integration form the non-volatile semiconductor memory elements MCN11 to MCNnm and the volatile semiconductor memory elements MCD11 to MCDnm on the same semiconductor substrate 1.

[Fourth Embodiment]

Figure 17A:
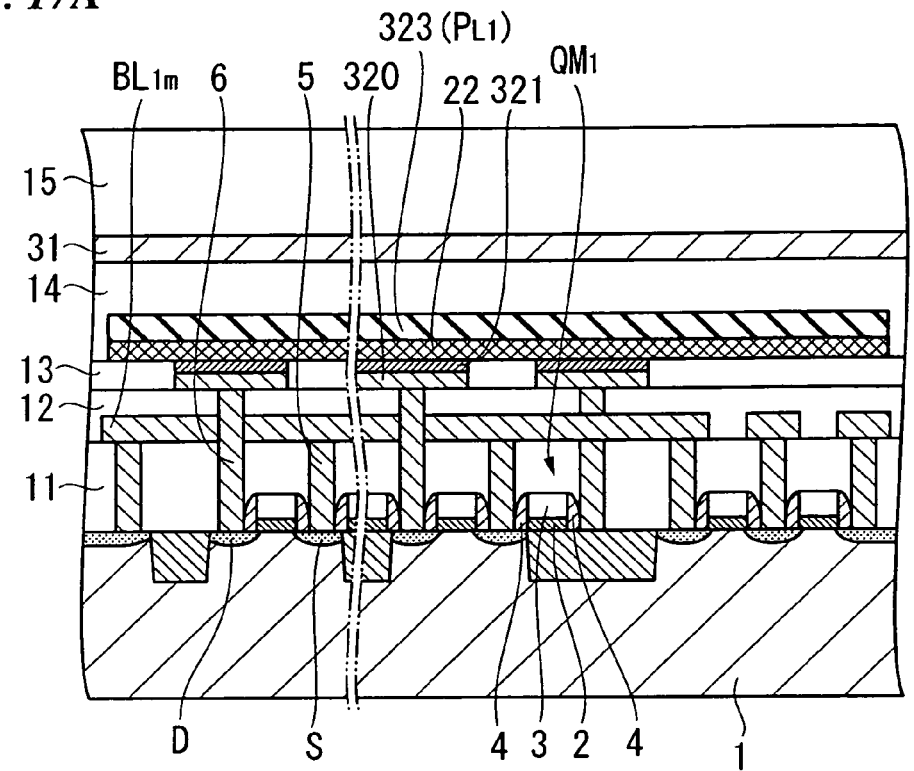
FIGS. 17A and 17B are partial sectional drawings that show the main portions of the semiconductor memory device of the fourth embodiment of the present invention.
Figure 17B:
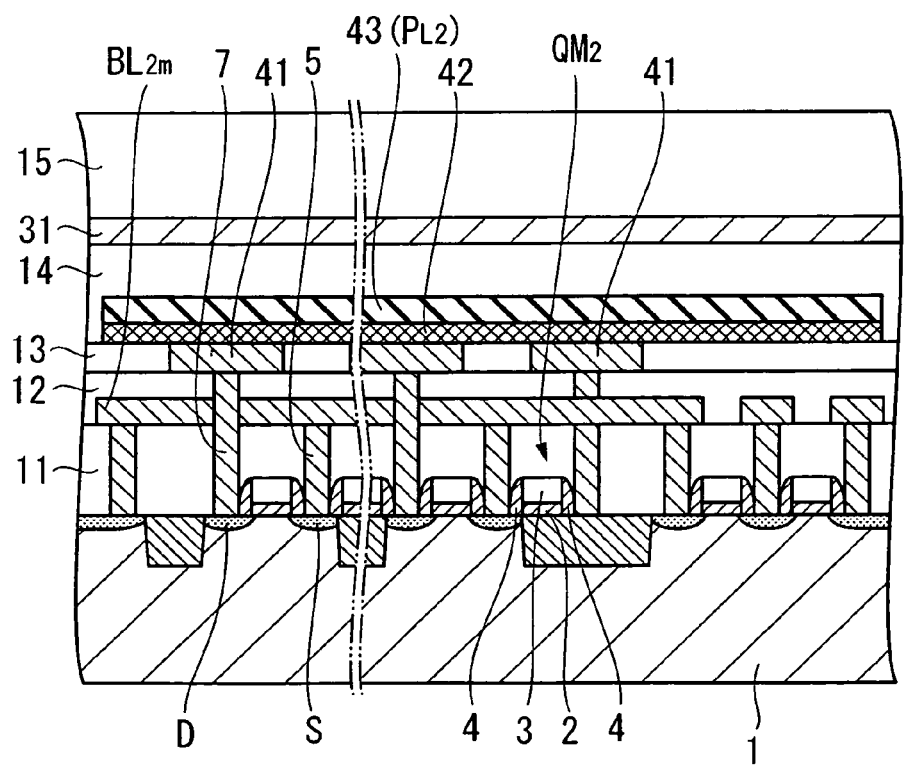

Next, a semiconductor memory device and the manufacturing method thereof of a fourth embodiment shall be described with reference to FIGS. 17A and 17B to FIGS. 22A and 22B. FIGS. 17A and 17B are partial sectional drawings showing the main portions of the semiconductor memory device of the present embodiment. Also, FIGS. 18A and 18B to FIGS. 22A and 22B are process drawings for describing the method of manufacturing the semiconductor memory device shown in FIGS. 17A and 17B.

(Semiconductor Memory Device)

The semiconductor memory device of the present embodiment is constituted by being provided with a non-volatile semiconductor memory element MCN1$m$ and a volatile semiconductor memory element MCD1$m$, similarly to the case of the first to third embodiments. Since the volatile semiconductor memory element MCD1$m$ has the same constitution as in the first to third embodiments, the description thereof shall be omitted, and the non-volatile semiconductor memory element MCN1$m$ shall be described here.

FIG. 17A is a sectional schematic view of the non-volatile semiconductor memory element MCN1$m$ according to the present embodiment, and FIG. 17B is a sectional schematic view of the volatile semiconductor memory element MCD1$m$ according to the present embodiment.

In FIG. 17A, gate electrodes 3 are formed on the gate insulating film 2 on a semiconductor substrate 1, a sidewall 4 is formed on both sides of each gate electrode 3, and a source region S and a drain region D are formed in the semiconductor substrate 1 on both sides of each gate electrode 3. The source region S is connected to a bit line BL1$m$ via a bit line contact plug 5, and the drain region D is connected to a variable resistance element RM via a resistance contact plug 6. In this way, the section transistor QM1 is constituted.

Moreover, the first interlayer insulation film 11 is formed on the semiconductor substrate 1, and the bit line BL1$m$ is formed on the first interlayer insulation film 11. Also, the bit line contact plug 5 is formed so as to penetrate the first interlayer insulation film 11. Furthermore, the second interlayer insulating film 12 is laminated on the first interlayer insulating film 11 and the bit line BL1$m$.

Next, the variable resistance element RM is constituted by a lower electrode 320 that is formed on the resistance contact plug 6, a first electrode 321 that is laminated on the lower electrode 320, the variable resistance layer 22 that contacts the first electrode 321, and a second electrode 323 that contacts the variable resistance layer 22 that are laminated one by one. The first electrode 321 is connected to the drain region D via the lower electrode 320 and the resistance contact plug 6. Moreover, the sum total thickness of the lower electrode 320 and the first electrode 321 is nearly the same as the third electrode 41 of the volatile semiconductor memory element MCD1$m$. Moreover, the second electrode 323 constitutes a portion of common plate line PL1. Furthermore, a fourth interlayer insulation film 14 that consists of silicon oxide or the like, a wiring layer 31, and a fifth interlayer insulating film 15 are laminated one by one on the second electrode 323.

The lower electrode 320 is formed with for example tungsten similarly to the third electrode 41 and the fourth electrode 43 of the volatile semiconductor memory element MCD11. On the other hand, the first electrode 321 is formed with silver, copper, zinc, or the like. Moreover, the second electrode 323 is formed with for example tungsten similarly to the lower electrode 320. The variable resistance layer 22 is constituted with the same material as the dielectric layer 42, similarly to the first embodiment. That is, the variable resistance layer 22 consists of any one or a mixture of a transition metal oxide, an aluminum oxide, and a silicone oxide. Examples of a transition metal oxide that constitutes the variable resistance layer 22 include tantalum oxide, niobium oxide, hafnium oxide, and zirconium oxide either singly or in combination, with hafnium oxide being preferable.

The operation of the semiconductor memory elements MCN11 to MCNnm of the present embodiment is the same as the case of the first embodiment.

(Method of Manufacturing Semiconductor Memory Device)

Next, a method of manufacturing the abovementioned semiconductor memory device shall be described with reference to the drawings.

The method of manufacturing the semiconductor memory device of the present embodiment consists of a transistor formation process and an element formation process that forms the variable resistance element RM and the capacitance element CM. The method, in the element formation process, consists of simultaneously forming the first electrode dummy electrode 321A and the third electrode 41 with the same material, removing a portion of the first electrode dummy electrode 321A to make the lower electrode 320, forming the first electrode 321 on the lower electrode 320 (the remaining first electrode dummy electrode 321A) with a material that differs from the third electrode 41, simultaneously forming the dielectric layer 42 and the variable resistance layer 22, and simultaneously forming the second electrode 323 and the fourth electrode 43 with the same material as the third electrode 41.

Figure 18A:
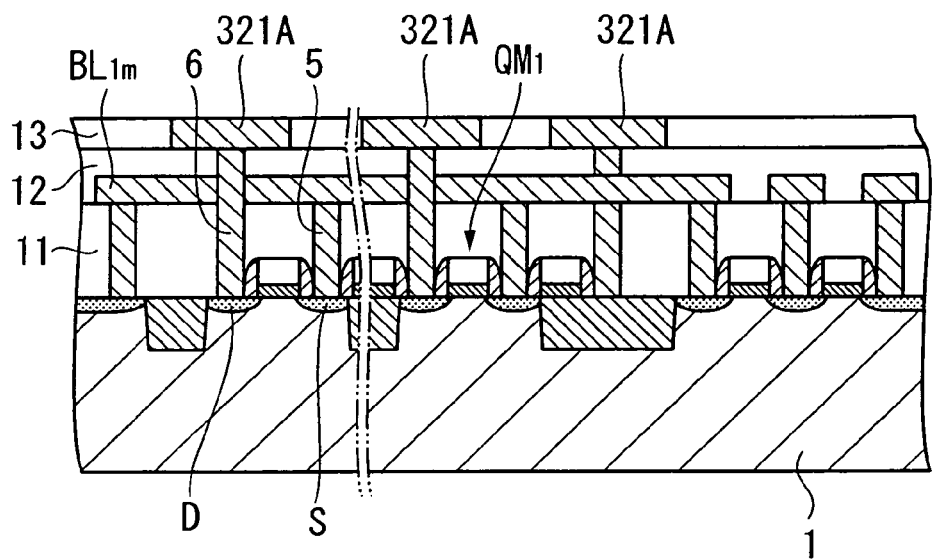
FIGS. 18A and 18B are process drawings for describing the method of manufacturing the semiconductor memory device shown in FIG. 17A and FIG. 17B, specifically being partial sectional drawings that show the formation process of the first electrode dummy electrode and the third electrode.
Figure 18B:
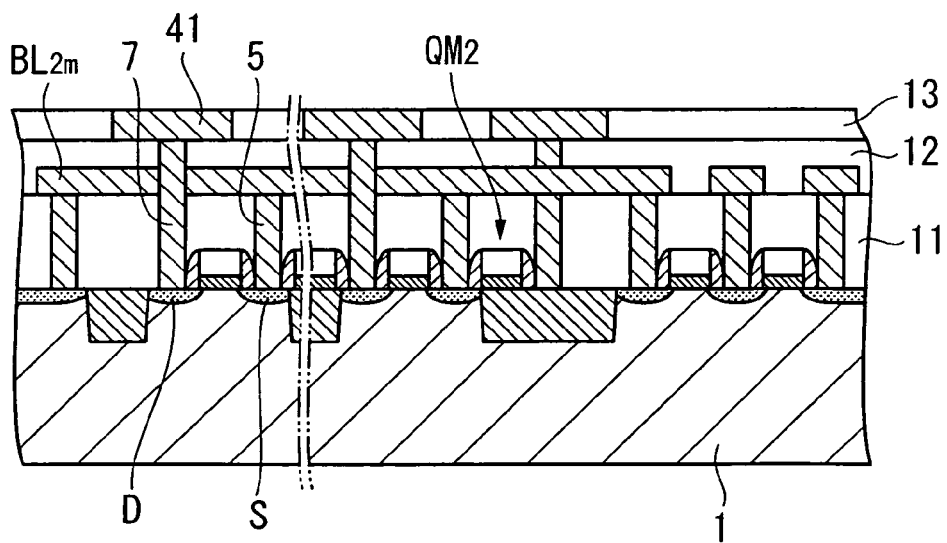
Figure 19A:
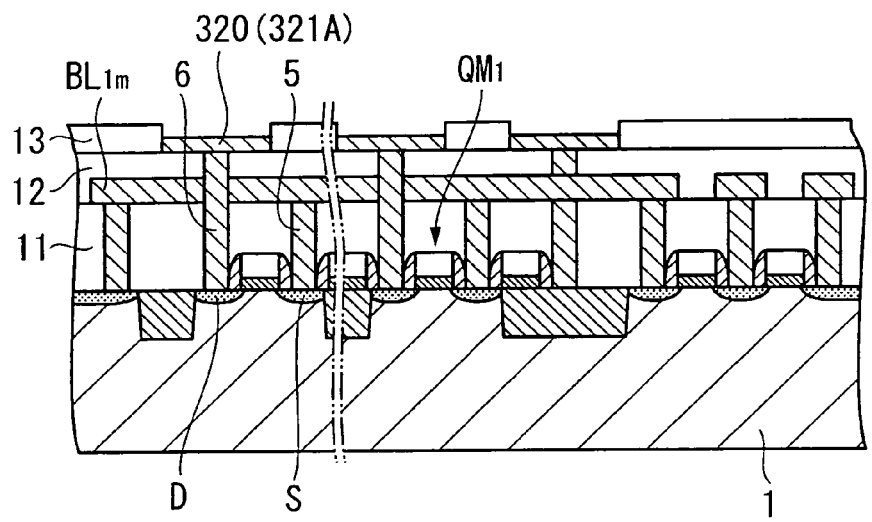
FIGS. 19A and 19B are process drawings for describing the method of manufacturing the semiconductor memory device shown in FIG. 17A and FIG. 17B, specifically being partial sectional drawings that show the process of removing a portion of the first electrode dummy electrode.
Figure 19B:
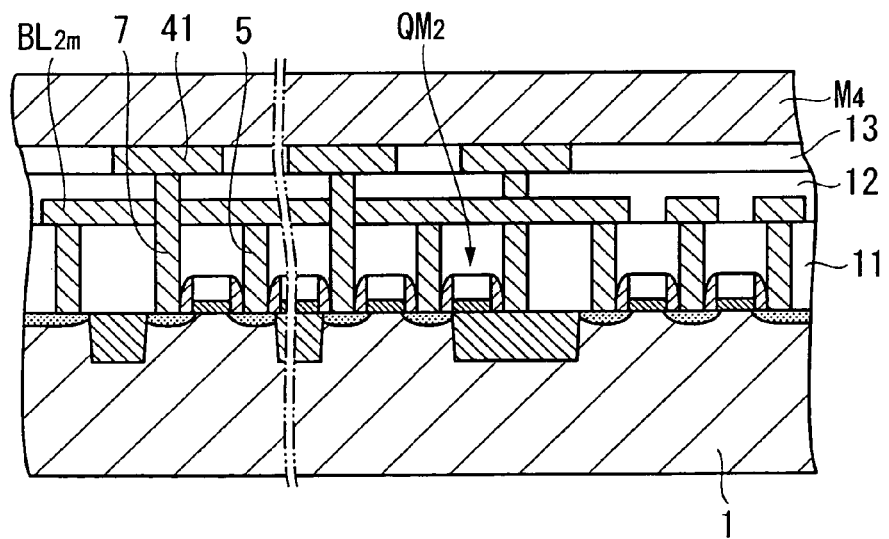
Figure 20A:
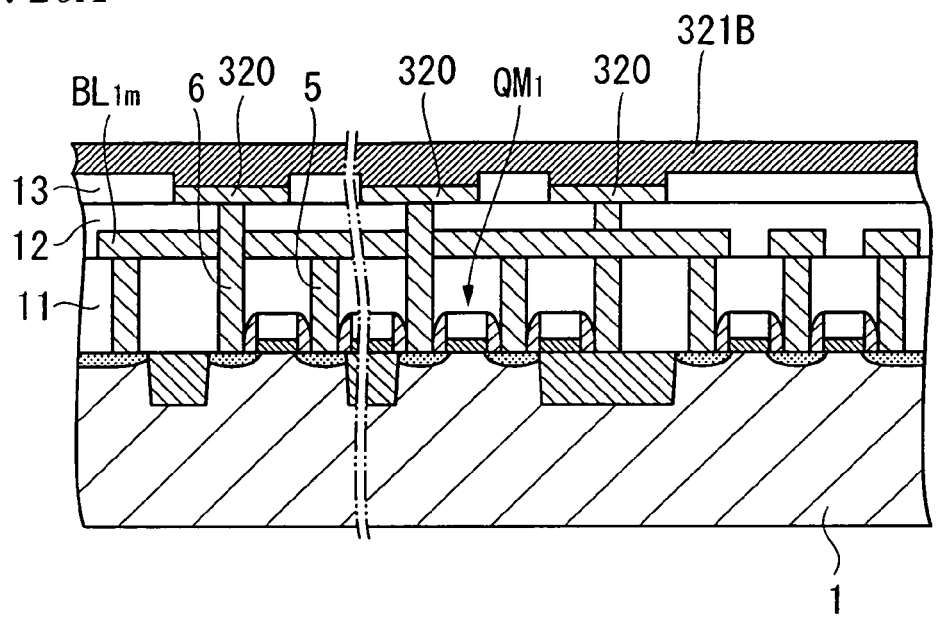
FIGS. 20A and 20B are process drawings for describing the method of manufacturing the semiconductor memory device shown in FIG. 17A and FIG. 17B, specifically being partial sectional drawings that show the process of forming the first electrode on the first electrode dummy electrode.
Figure 20B:
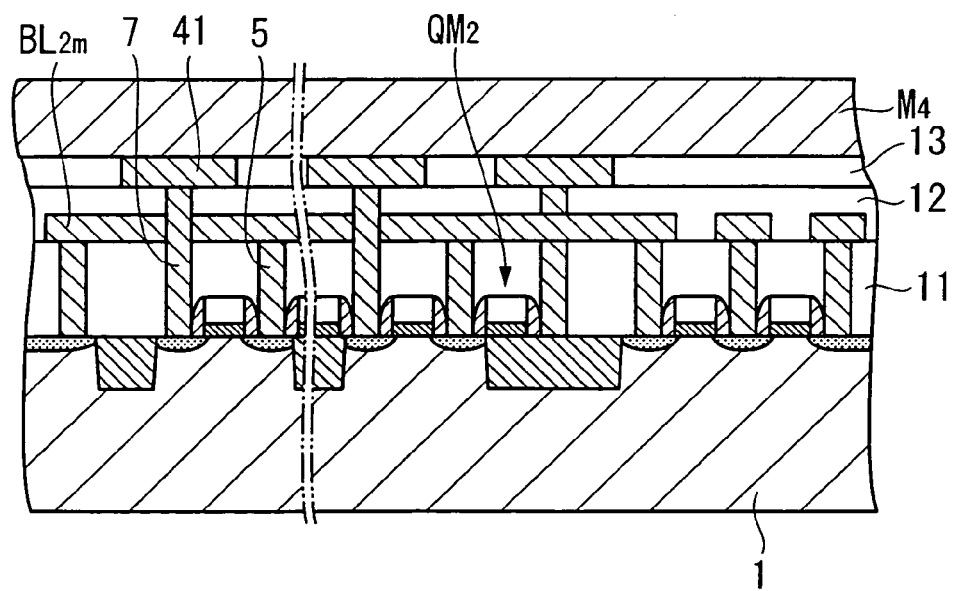
Figure 21A:
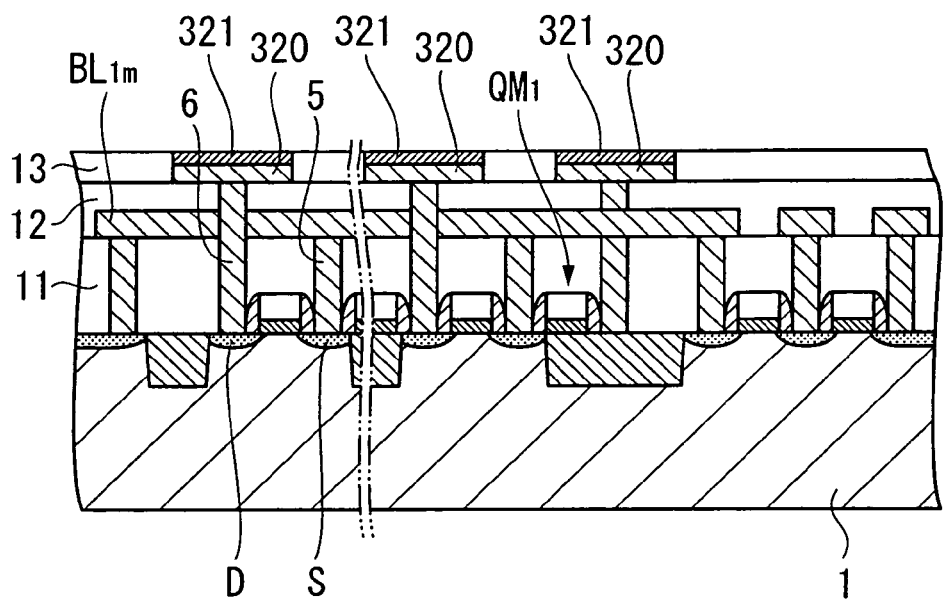
FIGS. 21A and 21B are process drawings for describing the method of manufacturing the semiconductor memory device shown in FIG. 17A and FIG. 17B, specifically being partial sectional drawings that show the process of making the first electrode flat.
Figure 21B:
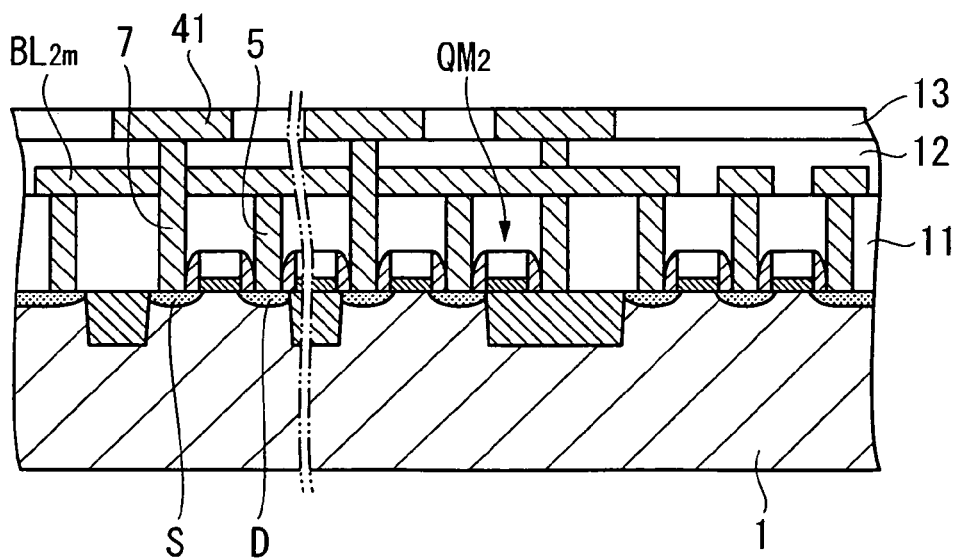
Figure 22A:
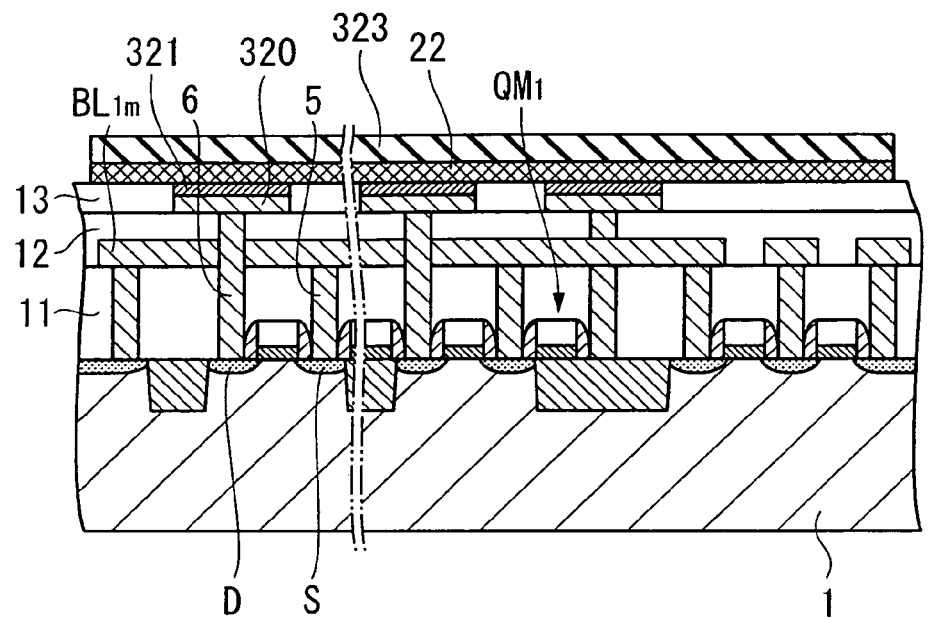
FIGS. 22A and 22B are process drawings for describing the method of manufacturing the semiconductor memory device shown in FIG. 17A and FIG. 17B, specifically being partial sectional drawings that show the formation process of the dielectric layer and variable resistance layer and the second and fourth electrodes.
Figure 22B:
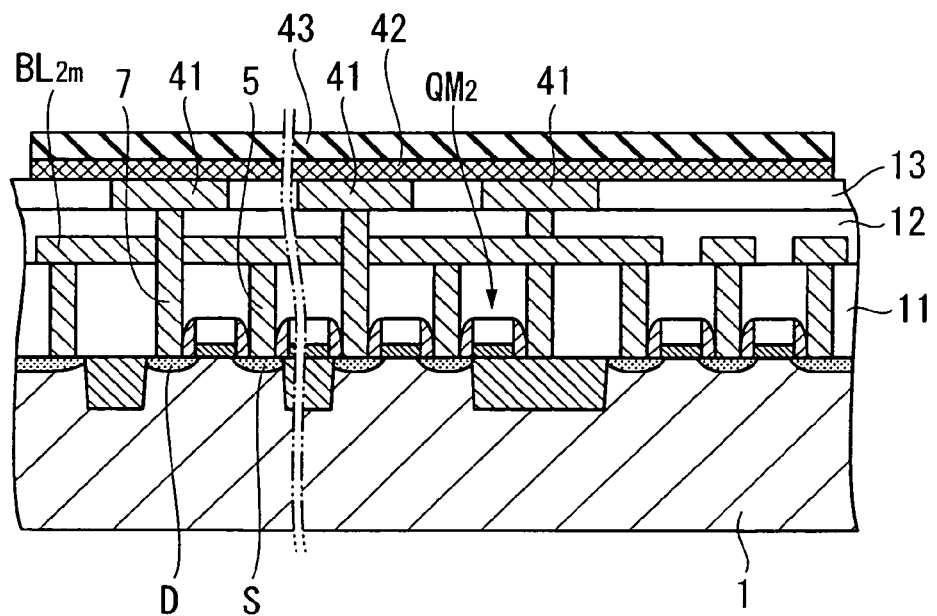

Hereinbelow, the description shall be made with reference to FIGS. 18A and 18B to FIGS. 22A and 22B. FIGS. 18A and 18B are partial sectional drawings that show the formation steps of the first electrode dummy electrode and the third electrode. FIGS. 19A and 19B are partial sectional drawings that show the step of removing a portion of the first electrode dummy electrode, and FIGS. 20A and 20B are partial sectional drawings that show the step of forming the first electrode on the first electrode dummy electrode. FIGS. 21A and 21B are partial sectional drawings that show the step of making the first electrode flat, and FIGS. 22A and 22B are partial sectional drawings that show the formation step of the dielectric layer and variable resistance layer and the second and fourth electrodes.

Transistor Formation Process

First, as shown in FIG. 18A and FIG. 18B, the selection transistor QM1 and selection transistor QM2 are formed similarly to the case of the first to third embodiments.

Element Formation Process

Then, the variable resistance element RM and the capacitance element CM are formed.

First, as shown in FIG. 18A, the first electrode dummy electrode 321A is formed on the resistance contact plug 6, and as shown in FIG. 18B, the third electrode 41 is formed on the capacitance contact plug 7. Specifically, a tungsten film for example is formed by the sputtering method over the entire surface of the second interlayer insulation film 12, and by patterning the tungsten film by photolithography, the first electrode dummy electrode 321A and the third electrode 41 are formed simultaneously. Next, the third interlayer insulating film 13 is laminated so as to cover the second interlayer insulating film 12, the first electrode dummy electrode 321A, and the third electrode 41, the third interlayer insulating film 13 is subjected to CMP processing to make it flat, and the upper surface of the first electrode dummy electrode 321A and the third electrode 41 are exposed.

Next, as shown in FIG. 19A, a portion of the first electrode dummy electrode 321A is removed by a means such as etching or the like. Specifically, for example after protecting the third electrode 41 by laminating a mask layer M4 on the formation region of the third electrode 41 as shown in FIG. 19B, the first electrode dummy electrode 321A is selectively etched by a means such as wet etching as shown in FIG. 19A, and the etching process is continued until for example the first electrode dummy electrode 321A becomes a thickness of half. Thus, the lower electrode 32 is formed.

Next, as shown in FIG. 20A, a metal film 321B which consists for example of a metal film such as silver, copper, zinc and the like is formed so that to cover the lower electrode 320 and the third interlayer insulating film 13.

Next, as shown in FIG. 21A, by performing a CMP process on the metal film 321B, it is flattened until the upper surface of the third interlayer insulating film 13 is exposed. Thereby, a state arises of the remainder of the metal film 321B being exposed at the upper surface of the third interlayer insulating film 13. Thus, the first electrode 321 consisting of a metal film such as silver, copper, zinc and the like is formed. Thereafter, the mask M3 that had protected the third electrode 41 is removed as shown in FIG. 21B.

Next, as shown in FIG. 22A and FIG. 22B, a compound layer consisting of a transition metal oxide or the like is laminated on the first electrode 321 and the third electrode 41. The compound layer laminated on the first electrode 321 becomes the variable resistance layer 22, and the compound layer laminated on the third electrode 41 becomes the dielectric layer 42. Thus, the variable resistance layer 22 and the dielectric layer 42 are formed simultaneously.

Next, as shown in FIG. 22A and FIG. 22B, for example a tungsten film is formed on the variable resistance layer 22 and the dielectric layer 42 by the sputtering method, and by patterning the tungsten film with photolithography, the second electrode 323 and the fourth electrode 43 are formed simultaneously.

Thus, the variable resistance element RM and the capacitance element CM are formed simultaneously.

Finally, by laminating the fourth interlayer insulation film 14, a wiring layer 31, and a fifth interlayer insulation film 15 one by one, the semiconductor memory device shown in FIGS. 17A and 17B is manufactured.

The manufacturing method for the above-mentioned semiconductor memory device is a method of forming the first electrode dummy electrode 321A simultaneously with the third electrode 41 and with the same material, and forming the first electrode 321 with a material that differs from the third electrode 41 after removing a portion of the first electrode dummy electrode 321A to make the lower electrode 320. Just by adding the series of steps of formation of the first electrode dummy electrode 321A, removal of a portion thereof, and formation of the first electrode 321, it is possible to readily and with a high integration form the non-volatile semiconductor memory elements MCN11 to MCNnm and the volatile semiconductor memory elements MCD11 to MCDnm on the same semiconductor substrate 1.

[Application Example of the Semiconductor Memory Device]

Figure 23:
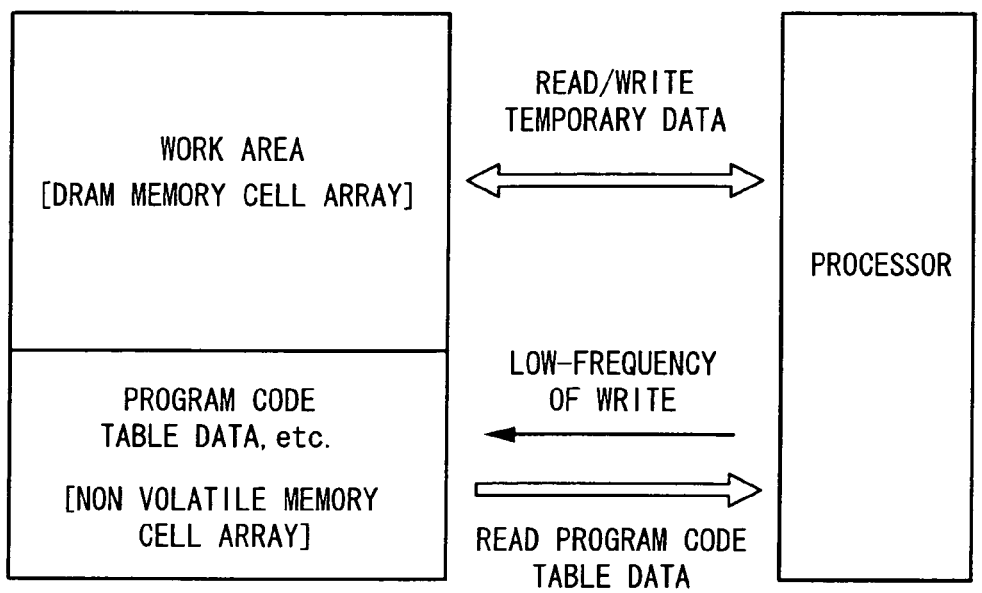
FIG. 23 is a conceptual diagram explaining the address space of the region that performs the writing of the volatile mode by the volatile memory element in the semiconductor memory device of the present invention, and the region that performs writing of the non-volatile mode by the non-volatile memory element.
Figure 24:
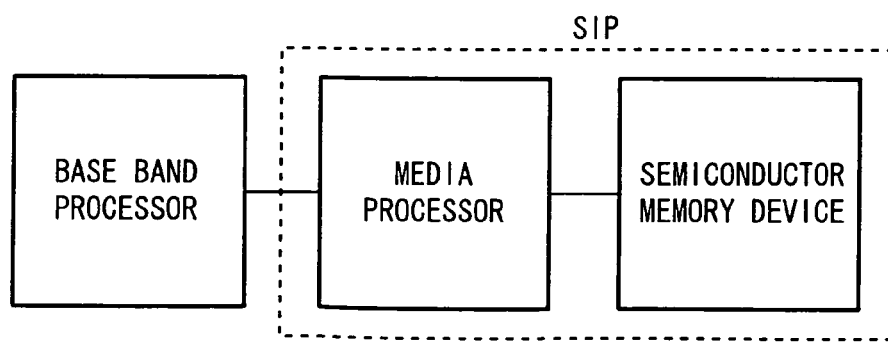
FIG. 24 is a block diagram showing the system configuration of a mobile phone which uses the semiconductor memory device of the present invention.
Figure 25:
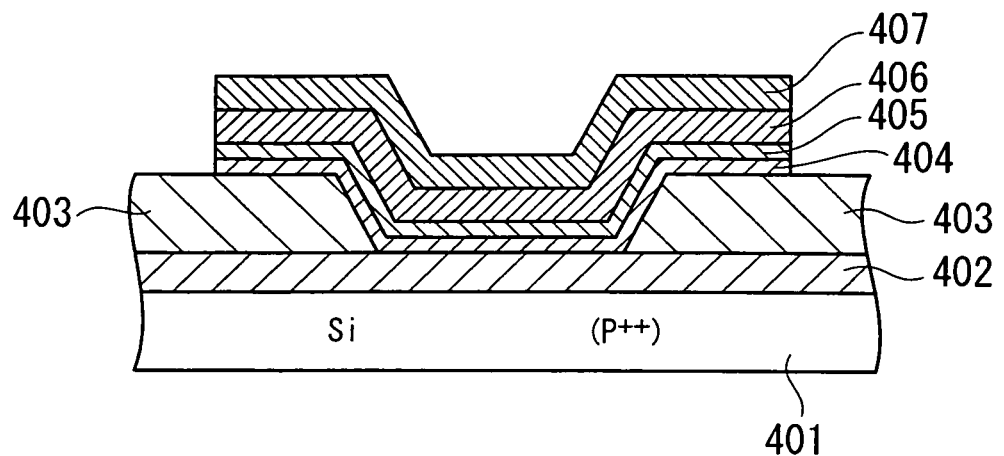
FIG. 25 is a cross-sectional schematic drawing showing the main portions of an example of a conventional semiconductor memory device.
Figure 26:
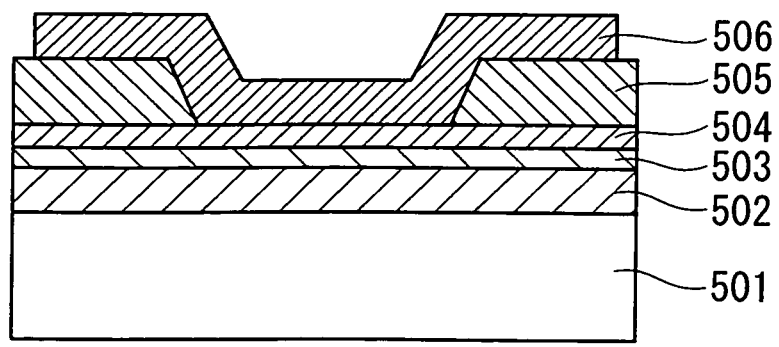
FIG. 26 is a cross-sectional schematic drawing showing the main portions of another example of a conventional semiconductor memory device.

Next, with reference to FIGS. 23 and 24, examples of application of the above-mentioned semiconductor memory device shall be described.

FIG. 23 is a drawing that shows the setup of the memory space of the main memory system which uses the semiconductor memory device of any of the first to fourth embodiments and the aspect of the processor and data transfer. The region of the volatile semiconductor memory element (DRAM memory array) that is formed using the process of the present invention on the same chip is defined/set as a processor work array. On the other hand, the region of the non-volatile semiconductor memory element (non-volatile memory array) that is formed using the process of the present invention on the same chip is not frequently rewritten as a program code or data table or the like, but high-speed read out is require, and so is defined/set as a region that retains data even when the power is cut. By setting in this manner, with just one memory chip, it is possible to meet the required memory needs as a system.

FIG. 24 shows the system configuration drawing of a portable telephone as an example of the system shown in FIG. 23.

This mobile telephone device is constituted by a system-in-package (SIP) that consists of a semiconductor memory device that stores program code, table data, and various parameters in the non-volatile memory cell region and uses a DRAM memory cell region as a work region and a media processor that are laminated and housed in a single package, and a baseband processor. By adopting this constitution, the system constitution is simplified, and a cost reduction and system miniaturization are realized.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
    a semiconductor substrate;
    a non-volatile semiconductor memory element formed over the semiconductor substrate, including a variable resistance element including a laminate comprising a first electrode, a variable resistance layer, and a second electrode; and
    a volatile semiconductor memory element formed over the semiconductor substrate, including a capacitance element including a laminate comprising a third electrode, a dielectric layer including a same material as the variable resistance layer, and a fourth electrode.

2. The semiconductor device according to claim 1, wherein either one of the first electrode or the second electrode includes a same material as the third electrode and the fourth electrode.

3. The semiconductor device according to claim 2, wherein the other one of the first electrode or the second electrode includes a different material than the third electrode and the fourth electrode.

4. The semiconductor device according to claim 1, wherein the fourth electrode is laminated on the second electrode.

5. The semiconductor device according to claim 1, wherein a material that constitutes the dielectric layer and the variable resistance layer includes any one or a mixture of a transition metal oxide, an aluminum oxide, and a silicone oxide.

6. The semiconductor device according to claim 5, wherein the transition metal oxide consists of any one or a mixture of tantalum oxide, niobium oxide, hafnium oxide, and zirconium oxide.

7. The semiconductor device according to claim 1, wherein the third electrode and the fourth electrode and either one of the first electrode and the second electrode include any of tungsten, titanium, platinum, and gold.

8. The semiconductor device according to claim 7, wherein the other one of the first electrode or the second electrode includes any of silver, copper, and zinc.

9. The semiconductor device according to claim 1, wherein the non-volatile semiconductor memory element includes a first selection transistor, the variable resistance element is connected to the first selection transistor, the volatile semiconductor memory element includes a second selection transistor, and the capacitance element is connected to the second selection transistor.

10. A semiconductor device comprising:
    a semiconductor substrate;
    a first selection transistor formed over the semiconductor substrate;
    a second selection transistor formed over the semiconductor substrate;
    a variable resistance element including a laminate comprising a first electrode that is connected to the first selection transistor, a variable resistance layer, and a second electrode; and
    a capacitance element including a laminate comprising a third electrode that is connected to the second selection transistor, a dielectric layer including a same material as the variable resistance layer, and a fourth electrode.

11. The semiconductor device according to claim 10, wherein the semiconductor substrate includes thereon a non-volatile semiconductor memory element and a volatile semiconductor memory element,
    the non-volatile semiconductor memory element including the first selection transistor and the variable resistance element that is connected to the first selection transistor, and
    the volatile semiconductor memory element including the second selection transistor and the capacitance element that is connected to the second selection transistor.

12. A data processing system comprising:
    a semiconductor device; and
    a processor,
    wherein between the processor and the semiconductor device, a data transfer is performed,
    wherein the semiconductor device comprises:
        a semiconductor substrate;
        a non-volatile semiconductor memory element formed over the semiconductor substrate, including a variable resistance element including a laminate comprising a first electrode, a variable resistance layer, and a second electrode; and
        a volatile semiconductor memory element formed over the semiconductor substrate, including a capacitance element including a laminate comprising a third electrode, a dielectric layer including a same material as the variable resistance layer, and a fourth electrode.

13. The data processing system according to claim 12, wherein either one of the first electrode or the second electrode includes a same material as the third electrode and the fourth electrode.

14. The data processing system according to claim 13, wherein the other one of the first electrode or the second electrode includes a different material than the third electrode and the fourth electrode.

15. The data processing system according to claim 12, wherein the fourth electrode is laminated on the second electrode.

16. The data processing system according to claim 12, wherein a material that constitutes the dielectric layer and the variable resistance layer includes any one or a mixture of a transition metal oxide, an aluminum oxide, and a silicone oxide.

17. The data processing system according to claim 16, wherein the transition metal oxide consists of any one or a mixture of tantalum oxide, niobium oxide, hafnium oxide, and zirconium oxide.

18. The data processing system according to claim 12, wherein the third electrode and the fourth electrode and either one of the first electrode and the second electrode include any of tungsten, titanium, platinum, and gold.

19. The data processing system according to claim 18, wherein the other one of the first electrode or the second electrode includes any of silver, copper, and zinc.

20. The data processing system according to claim 12, wherein the non-volatile semiconductor memory element includes a first selection transistor, the variable resistance element is connected to the first selection transistor, the volatile semiconductor memory element includes a second selection transistor, and the capacitance element is connected to the second selection transistor.

21. A semiconductor device comprising:
a semiconductor substrate;
a non-volatile semiconductor memory element formed over the semiconductor substrate, including a programmable element including a laminate comprising a first electrode, a recording layer, and a second electrode, the programmable element having a first state and a second state, the programmable element having a first resistance value in the first state and a second resistance value that is different from the first resistance value in the second state; and
a volatile semiconductor memory element formed over the semiconductor substrate, including a capacitance element including a laminate comprising a third electrode, a dielectric layer including a same material as the recording layer, and a fourth electrode,
wherein the material comprises Al and a transition metal oxide.

22. A data processing system comprising:
a semiconductor device; and
a processor;
wherein between the processor and the semiconductor device, a data transfer is performed,
wherein the semiconductor device comprises:
a semiconductor substrate;
a non-volatile semiconductor memory element formed over the semiconductor substrate, including a programmable element including a laminate comprising a first electrode, a recording layer, and a second electrode, the programmable element having a first state and a second state, the programmable element having a first resistance value in the first state and a second resistance value that is different from the first resistance value in the second state; and
a volatile semiconductor memory element formed over the semiconductor substrate, including a capacitance element including a laminate comprising a third electrode, a dielectric layer including a same material as the recording layer, and a fourth electrode,
wherein the material comprises Al and a transition metal oxide.

* * * * *